United States Patent
Suzuki et al.

(10) Patent No.: US 11,398,331 B2
(45) Date of Patent: Jul. 26, 2022

(54) ACTUATOR CAPABLE OF PERFORMING RATIONAL MOTION

(71) Applicants: TDK Corporation, Tokyo (JP); TOKYO INSTITUTE OF TECHNOLOGY, Tokyo (JP)

(72) Inventors: Kenichi Suzuki, Tokyo (JP); Akira Suzuki, Tokyo (JP); Shusuke Ichihashi, Tokyo (JP); Tadahiko Shinshi, Tokyo (JP); Noriei Azuma, Tokyo (JP)

(73) Assignees: TDK CORPORATION, Tokyo (JP); TOKYO INSTITUTE OF TECHNOLOGY, Tokyo (JP)

( * ) Notice: Subject to any disclaimer, the term of this patent is extended or adjusted under 35 U.S.C. 154(b) by 272 days.

(21) Appl. No.: 16/627,038

(22) PCT Filed: Jul. 18, 2018

(86) PCT No.: PCT/JP2018/026911
§ 371 (c)(1),
(2) Date: Dec. 27, 2019

(87) PCT Pub. No.: WO2019/017387
PCT Pub. Date: Jan. 24, 2019

(65) Prior Publication Data
US 2020/0126703 A1   Apr. 23, 2020

(30) Foreign Application Priority Data

Jul. 20, 2017  (JP) .............................. JP2017-140787

(51) Int. Cl.
*H01F 7/08*   (2006.01)
*H01F 7/126*  (2006.01)
*H05K 1/18*   (2006.01)

(52) U.S. Cl.
CPC ............. *H01F 7/081* (2013.01); *H01F 7/126* (2013.01); *H05K 1/181* (2013.01); *H05K 2201/10121* (2013.01)

(58) Field of Classification Search
CPC .......... H01F 7/081; H01F 7/122; H01F 7/126; H01F 2007/068; H01F 7/14; H02K 33/14;
(Continued)

(56) References Cited

U.S. PATENT DOCUMENTS

| 9,287,062 B2 * | 3/2016 | Becker ................. G01R 1/206 |
| 2003/0102721 A1 * | 6/2003 | Ueta ..................... H02K 41/03 |
| | | 310/12.06 |
| 2003/0102722 A1 * | 6/2003 | Ueta ..................... H02K 41/03 |
| | | 310/12.06 |

FOREIGN PATENT DOCUMENTS

| JP | 11-196560 A | 7/1999 | |
| WO | WO-2008093597 A1 * | 8/2008 | .............. H04R 11/00 |

OTHER PUBLICATIONS

Machine Translation of WO2008093597A1 (Year: 2008).*
(Continued)

*Primary Examiner* — Bernard Rojas
(74) *Attorney, Agent, or Firm* — McDermott Will & Emery LLP

(57) ABSTRACT

An actuator includes a first magnet whose magnetic pole surface has an N pole and a second magnet whose magnetic pole surface has an S pole. When current flows from one end of a first wiring to the other end, the current circulates in one direction at least partially on the first magnet in a first area, while it circulates in a direction opposite to the one direction at least partially on the second magnet in the first area. When current flows from one end of a second wiring to the other end, the current circulates in the direction opposite to the one direction at least partially on another first magnet in the
(Continued)

second area, while it circulates in the one direction at least partially on another second magnet in the second area.

20 Claims, 26 Drawing Sheets

(58) Field of Classification Search
CPC .................. H02K 41/03; H05K 1/181; H05K 2201/10121
See application file for complete search history.

(56) References Cited

OTHER PUBLICATIONS

R Fujiwara et al., "Multi-pole Magnetization of Thin Film Neodymium Permanent Magnet and Fabrication of a MEMS Linear Motor Using the Magnetized Magnet", Journal of the Japan Society for Precision Engineering, vol. 79, Issue 8, Aug. 2013, pp. 773-778, with partial English translation.

International Search Report issued in corresponding International Patent Application No. PCT/JP2018/026911, dated Oct. 9, 2018, with English translation.

* cited by examiner

ACTUATOR CAPABLE OF PERFORMING RATIONAL MOTION

CROSS REFERENCE

This application is the U.S. National Phase under 35 US.C. § 371 of International Application No. PCT/JP2018/026911, filed on Jul. 18, 2018, which claims the benefit of Japanese Application No. 2017-140787, filed on Jul. 20, 2017, the entire contents of each are hereby incorporated by reference.

TECHNICAL FIELD

The present invention relates to an actuator and, more particularly, to an actuator capable of performing rotational motion.

BACKGROUND ART

A typical actuator using electromagnetic force performs reciprocating motion in one axial direction. On the other hand, Patent Document 1 describes an actuator capable of performing two-dimensional motion by arranging magnets in a matrix. The actuator described in Patent Document 1 assigns four coils to one magnet and controls the direction of current to flow in these coils, thereby achieving two-dimensional motion.

CITATION LIST

Patent Document

[Patent Document 1] JP 11-196560 A

Non-Patent Document

[Non-Patent Document 1] Multi-pole Magnetization of Thin Film Neodymium Permanent Magnet and Fabrication of a MEMS Linear Motor Using the Magnetized Magnet (Journal of the Japan Society for Precision Engineering, Vol. 79, Issue 8, 2013, p 773-p 778)

SUMMARY OF INVENTION

Problem to be Solved by the Invention

However, the actuator described in Patent Document 1 has a problem of difficulty in achieving miniaturization since four coils are assigned to one magnet. Particularly, it is difficult to reduce the size in the thickness direction perpendicular to the drive plane, and thus the actuator described in Patent Document 1 is not suitable for mobile devices requiring height reduction. Further, although capable of performing two-dimensional motion, the actuator described in Patent Document 1 cannot perform rotational motion.

As an actuator having a reduced height, there is known a linear motor described in Non-Patent Document 1. However, the linear motor described in Non-Patent Document performs only reciprocating motion in one axial direction, but cannot perform two-dimensional motion or rotational motion.

It is therefore an object of the present invention to provide an actuator achieving both reduced height and rotational motion.

Means for Solving the Problem

An actuator according to one aspect of the present invention is provided with: a magnet structure including a plurality of first magnets whose each magnetic pole surface has an N pole and a plurality of second magnets whose each magnetic pole surface has an S pole; and a circuit board including first and second wirings and facing the magnetic pole surfaces of the respective first and second magnets through a gap. The magnet structure includes first and second areas. When current is made to flow from one end of the first wiring to the other end thereof, the current circulates in one direction at least partially on each of the first magnets positioned in the first area, while it circulates in the direction opposite to the one direction at least partially on each of the second magnets positioned in the first area. When current is made to flow from one end of the second wiring to the other end thereof, the current circulates in the direction opposite to the one direction at least partially on each of the first magnets positioned in the second area, while it circulates in the one direction at least partially on each of the second magnets positioned in the second area.

According to the present invention, when current is made to flow in the first and second wirings, it is possible to realize rotational motion about a predetermined axis (e.g., x-axis) parallel to the magnetic pole surface.

In the present invention, the magnet structure may have a structure in which the magnetic pole surfaces of the plurality of the first magnets and the magnetic pole surfaces of the plurality of the second magnets are alternately arranged in a first direction and a second direction perpendicular to the first direction on a first plane extending in the first and second directions. This allows a larger drive force to be obtained.

In the present invention, the first and second areas may be arranged in the second direction, and the magnet structure and circuit board may be configured to be relatively tilted about an axis extending in the first direction when current is made to flow from one end of the first wiring to the other end thereof and also from one end of the second wiring to the other end thereof. This allows rotational motion about the axis extending in the first direction to be realized.

In the present invention, the size of the gap may be configured to be changed when current is made to flow from one end of the first wiring to the other end thereof and also from the other end of the second wiring to one end thereof. This allows driving in a direction perpendicular to the magnetic pole surface to be realized.

In the present invention, the circuit board may further include third and fourth wirings, the magnet structure may further include third and fourth areas arranged in the second direction, the first and third areas may be arranged in the first direction, and the second and fourth areas may be arranged in the first direction. It may be configured such that, when current is made to flow from one end of the third wiring to the other end thereof, the current circulates in one direction at least partially on each of the first magnets positioned in the first and second areas and also circulates in a direction opposite to the one direction at least partially on each of the second magnets positioned in the first and second areas, and when current is made to flow from one end of the fourth wiring to the other end thereof, the current circulates in the direction opposite to the one direction at least partially on each of the first magnets positioned in the third and fourth areas and also circulates in the one direction at least partially on each of the second magnets positioned in the third and fourth areas. Thus, when current is made to flow in the third and fourth wirings, it is possible to realize rotational motion about an axis (e.g., y-axis) extending in the second direction.

In the present invention, the first and second wirings may be provided on a second plane parallel to the first plane, and the third and fourth wirings may be provided on a third plane parallel to the first plane and different from the second plane. This allows rotational motion to be realized by using two wiring layers provided on the circuit board. Alternatively, the first to fourth wirings may be provided on a third plane parallel to the first plane. This allows rotational motion to be realized by using one wiring layer provided on the circuit board.

In the present invention, the circuit board may further include fifth and sixth wirings, the magnet structure may include a first array part in which the first and second magnets are alternately arranged in the first direction and a second array part in which the first and second magnets are alternately arranged in the second direction, the fifth wiring may cross, in the second direction, at least partially each of the first and second magnets included in the first array part, and the sixth wiring may cross, in the first direction, at least partially each of the first and second magnets included in the second array part. Thus, when current is made to flow in the fifth and sixth wirings, it is possible to realize two-dimensional motion.

In the present invention, the fifth wiring may include a first wiring part that crosses each of the first magnets in the second direction and a second wiring part that crosses each of the second magnets in the second direction, the sixth wiring may include a third wiring part that crosses each of the first magnets in the first direction and a fourth wiring part that crosses each of the second magnets in the first direction, current may be made to flow in mutually opposite directions in the first wiring part and second wiring part, and current may be made to flow in mutually opposite directions in the third wiring part and fourth wiring part. This allows a larger drive force to be obtained.

In the present invention, the fifth wiring may be provided on a fourth plane parallel to the first plane, and the six wiring may be provided on a fifth plane parallel to the first plane and different from the fourth plane. Thus, by adding two wiring layers on the circuit board, two-dimensional motion can be realized.

In the present invention, the fifth wiring may include a first part that covers the first and third areas and a second part that covers the second and fourth areas, and current may be made to flow in the first and second parts independently of each other. Thus, when opposite-direction currents are made to flow in the first and second parts, it is possible to realize rotational motion about a predetermined axis (e.g., z-axis) perpendicular to the magnetic pole surface.

In the present invention, the circuit board may further include a seventh wiring, the seventh wiring may include a fifth wiring part that circles at least partially on each of the first magnets positioned in the first to fourth areas and a sixth wiring part that circles at least partially on each of the second magnets positioned in the first to fourth areas, and currents that circulate in the opposite directions may be made to flow in the fifth and sixth wiring parts. This allows motion in a direction perpendicular to the magnetic pole surface and rotational motion about a predetermined axis (e.g., x-axis) parallel to the magnetic pole surface to be controlled independently of each other.

In the present invention, the circuit board may further include an eighth wiring, and the eighth wiring may include a seventh wiring part that crosses each of the first magnets in the second direction and an eighth wiring part that crosses each of the second magnets in the second direction. In a part of the eighth wiring that covers the first and third areas, opposite-direction currents may be made to flow in the seventh and eighth wiring parts, and in a part of the eighth wiring that covers the second and fourth areas, opposite-direction currents may be made to flow in the seventh and eighth wiring parts. In a part of the seventh wiring part that covers the first and third areas and in a part thereof that covers the second and fourth areas, opposite-direction currents may be made to flow. In a part of the eighth wiring part that covers the first and third areas and in a part thereof that covers the second and fourth areas, opposite-direction currents may be made to flow. This allows motion in a direction parallel to the magnetic pole surface and rotational motion about a predetermined axis (e.g., z-axis) perpendicular to the magnetic pole surface to be controlled independently of each other.

An actuator according to another aspect of the present invention is provided with: a magnet structure including a plurality of first magnets whose each magnetic pole surface has an N pole and a plurality of second magnets whose each magnetic pole surface has an S pole; and a circuit board including first and second wirings and facing the magnetic pole surfaces of the respective first and second magnets through a gap. The magnetic structure includes a first area and a second area. The first area includes a first array part in which the first and second magnets are alternately arranged in a first direction, the second area includes a second array part in which the first and second magnets are alternately arranged in the first direction, and the first and second areas are arranged in a second direction perpendicular to the first direction. The first wiring includes a first wiring part that crosses each of the first magnets in the second direction and a second wiring part that crosses each of the second magnets in the second direction, and the second wiring includes a third wiring part that crosses each of the first magnets in the second direction and a fourth wiring part that crosses each of the second magnets in the second direction. Opposite-direction currents are made to flow in the first and second wiring parts, and opposite-direction currents are made to flow in the third and fourth wiring parts. Opposite-direction currents can be made to flow in the first and third wiring parts, and opposite-direction currents can be made to flow in the second and fourth wiring parts.

According to the present invention, when current is made to flow in the first and second wirings, it is possible to realize rotational motion about a predetermined axis (e.g., z-axis) perpendicular to the magnetic pole surface.

In the present invention, the first and second wiring parts and third and fourth wiring parts may be separated from each other to allow currents to flow independently of each other. This allows a first part and a second part of the magnet structure to be driven independently of each other.

In the present invention, the same direction current may be made to flow in the first and third wiring parts, and the same direction current may be made to flow in the second and fourth wiring parts. Thus, in addition to rotational motion, shift motion along a predetermined axis (e.g., x-axis) parallel to the magnetic pole surface can be realized.

In the present invention, the size of the first and second magnets in the first and second directions may be 1 mm or less. The thickness of the magnet structure in a third direction perpendicular to the first and second directions may be 1 mm or less. Thus, it is possible to provide an actuator having a very small size and a reduced height.

The actuator according to the present invention may further include a support substrate for supporting the magnet structure, and the thermal diffusivity of the support substrate may be lower than that of the magnet structure. This facilitates manufacture of a small and thin magnet structure.

In the present invention, an image sensor may be fixed to one of the circuit board and magnet structure. This allows the actuator of the present invention to be used as an actuator for camera-shake correction.

Advantageous Effects of the Invention

As described above, according to the present invention, there can be provided an actuator achieving both reduced height and rotational motion.

MODE FOR CARRYING OUT THE INVENTION

Preferred embodiments of the present invention will be explained below in detail with reference to the accompanying drawings.

First Embodiment

Figure 1:
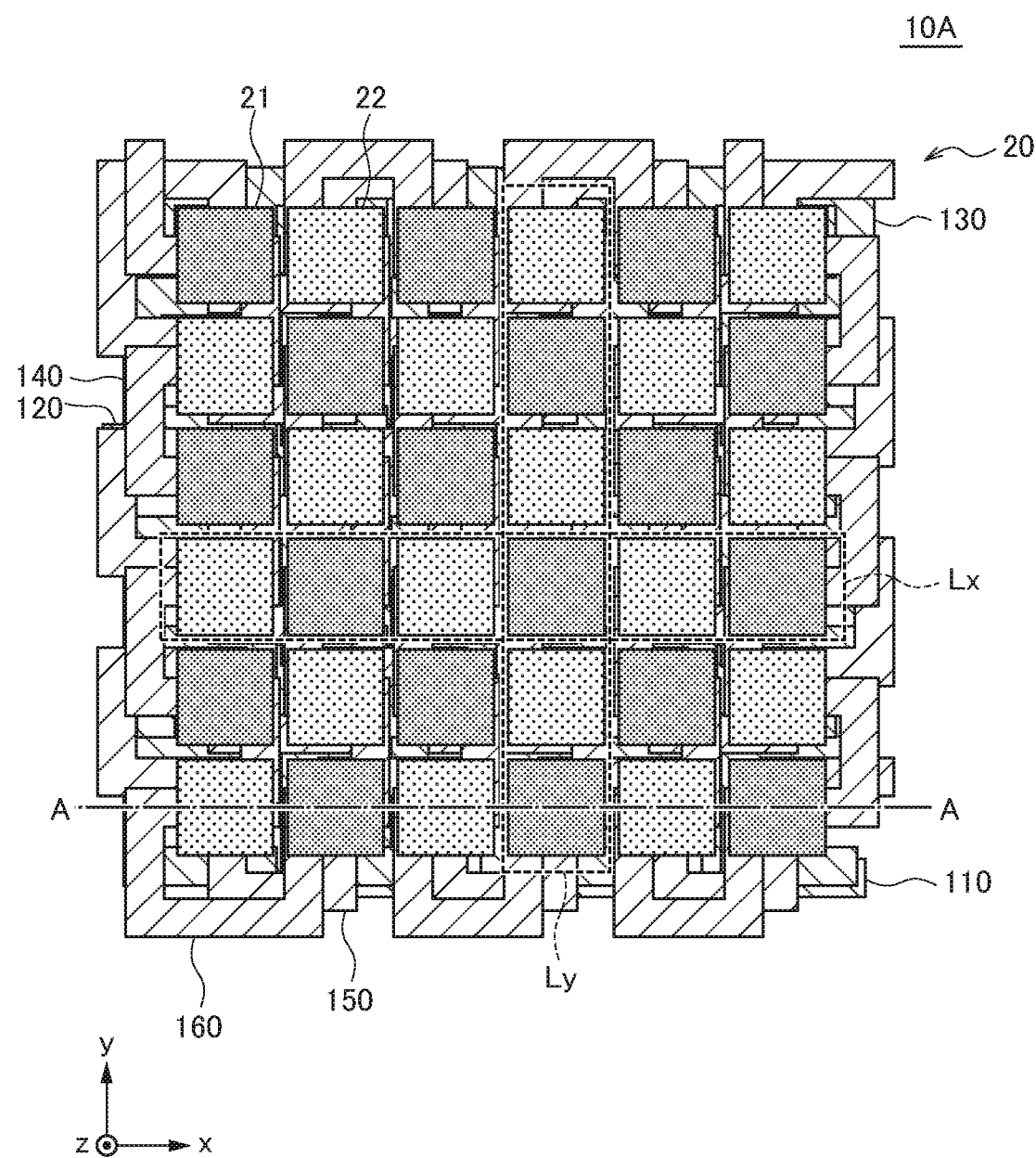
FIG. 1 is a schematic plan view illustrating the structure of the main part of an actuator 10A according to a first embodiment of the present invention.
Figure 2:
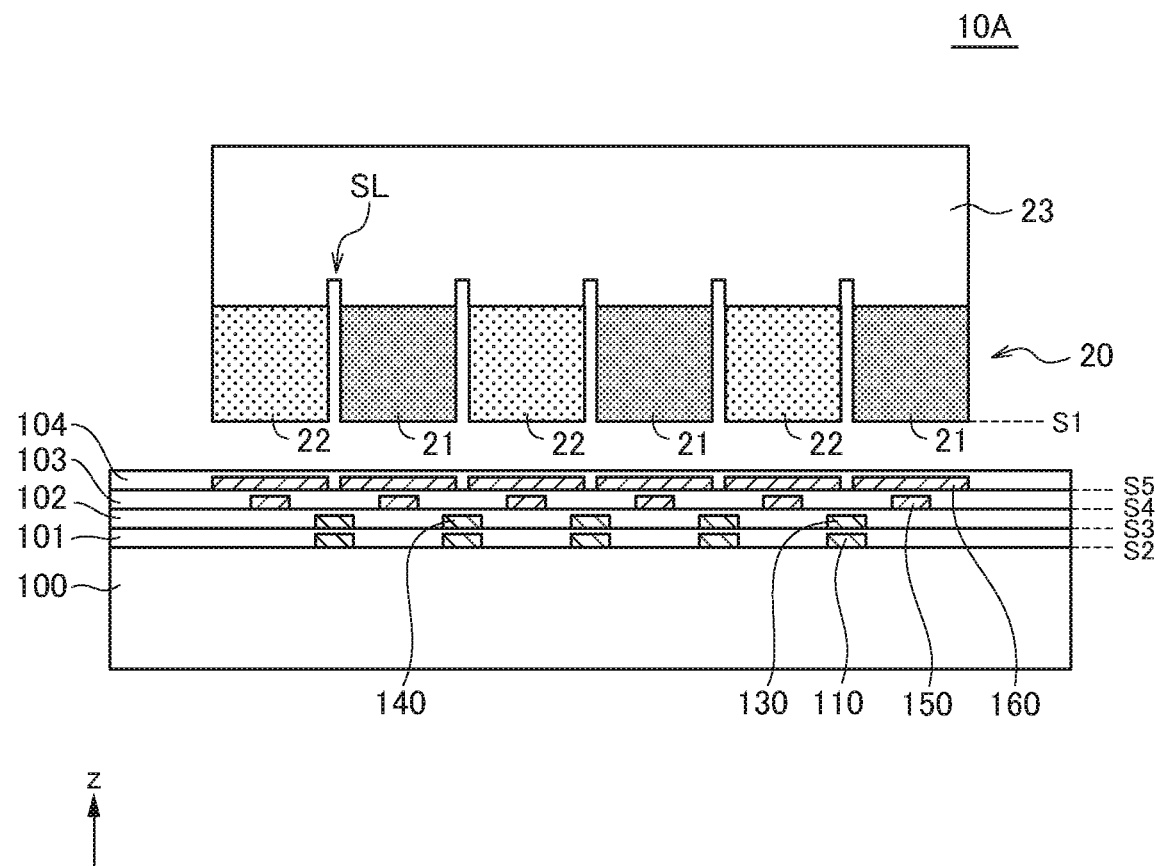
FIG. 2 is a schematic cross-sectional view taken along line A-A in FIG. 1.

FIG. 1 is a schematic plan view illustrating the structure of the main part of an actuator 10A according to the first embodiment of the present invention. FIG. 2 is a schematic cross-sectional view taken along line A-A in FIG. 1.

As illustrated in FIGS. 1 and 2, the actuator 10A according to the present embodiment has a magnet structure 20 including a plurality of first and second magnets 21 and 22 arranged in a matrix in the x- and y-directions and a circuit board 100 overlapping the magnet structure 20 in the z-direction and having first to sixth wirings 110, 120, 130, 140, 150 and 160 formed thereon.

The magnet structure 20 is provided on a support substrate 23 made of glass or the like, and having a magnetic pole surface positioned on a first plane S1 extending in the xy direction. For easy viewing of the drawing, the support substrate 23 is omitted in FIG. 1. In each of the first magnets 21 constituting the magnet structure 20, the magnetic pole surface positioned on the first plane S1 has an N pole; conversely, in each of the second magnets 22 constituting the magnet structure 20, the magnetic pole surface positioned on the first plane S1 has an S pole. These first and second magnets 21 and 22 are arranged alternately in a matrix. That is, each row extending in the x-direction constitutes a first array part Lx in which first and second magnets 21 and 22 are alternately arranged in the x-direction, and each column extending in the y-direction constitutes a second array part Ly in which first and second magnets 21 and 22 are alternately arranged in the y-direction.

Figure 3:
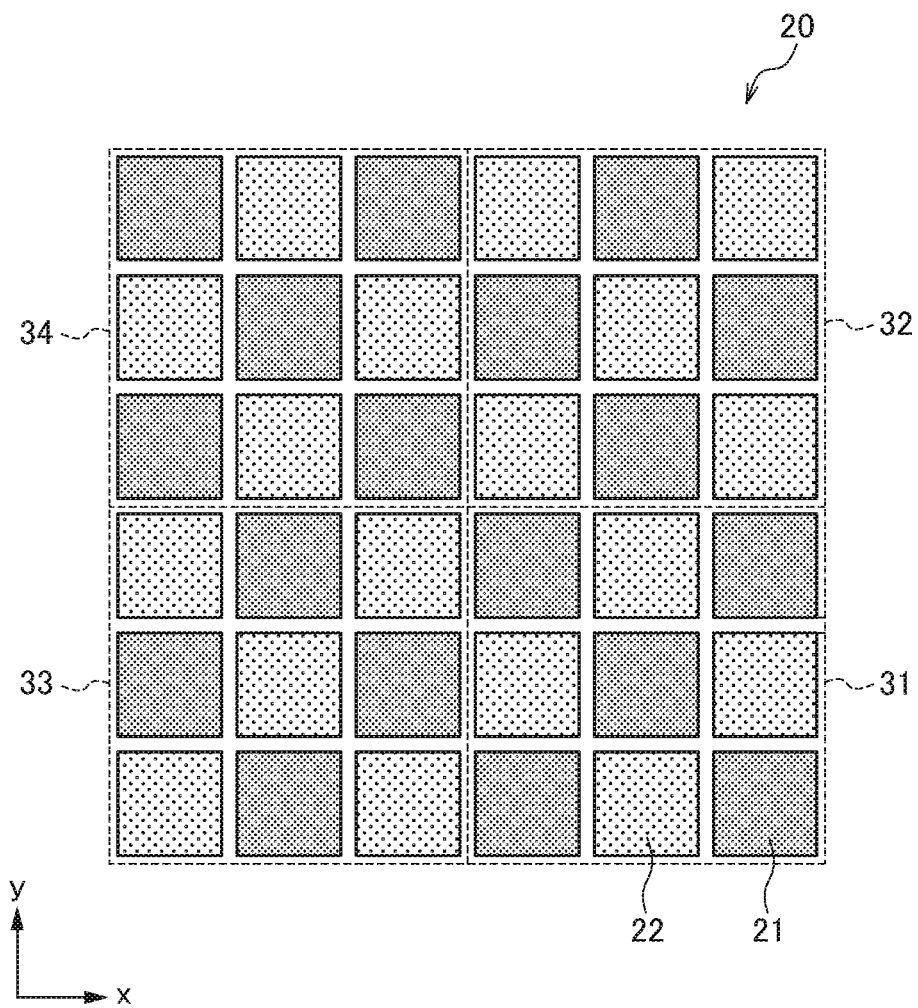
FIG. 3 is a schematic diagram for explaining a positional relationship among first to fourth areas 31 to 34 included in the magnet structure 20.

In the example illustrated in FIGS. 1 and 2, the first array part Lx includes six magnets (21, 22), and the second array part Ly includes six magnets (21, 22); however, in the present invention, the number of the first and second magnets (21, 22) in one row or in one column is not limited to this. In the present embodiment, the magnet structure 20 is divided into four areas 31 to 33 as illustrated in FIG. 3. According to FIG. 3, the first area 31 is positioned at the lower right portion, the second area 32 is positioned at the upper right portion, the third area 33 is positioned at the lower left portion, and the fourth area 34 is positioned at the upper left portion. Thus, the first and second areas 31 and 32 are arranged in the y-direction, the third and fourth areas 33 and 34 are arranged in the y-direction, the first and third areas 31 and 33 are arranged in the x-direction, and the second and fourth areas 32 and 34 are arranged in the x-direction. Although not particularly limited, in the present embodiment, the first to fourth areas each include 3×3 magnets (21, 22).

As illustrated in FIG. 2, in the present embodiment, the adjacent first and second magnets 21 and 22 are separated from each other through a slit SL, and the slit SL reaches the surface layer of the support substrate 23. Although such a slit SL may not necessarily be formed in the present invention, it is advantageous to form such a slit SL in the manufacturing process of the magnet structure 20 as will be described later.

The first to sixth wirings 110, 120, 130, 140, 150 and 160 are stacked on the circuit board 100. The main surface of the circuit board 100 constitutes a second plane S2 parallel to the first plane S1, and the first and second wirings 110 and 120 are formed on the main surface of the circuit board 100, i.e., the second plane S2. The first and second wirings 110 and 120 are covered with an insulating film 101. The surface of the insulating film 101 constitutes a third plane S3 parallel to the first plane S1, and the third and fourth wirings 130 and 140 are formed on the surface of the insulating film 101, i.e., the third plane S3. The third and fourth wirings 130 and 140 are covered with an insulating film 102. The surface of the insulating film 102 constitutes a fourth plane S4 parallel to the first plane S1, and the fifth wiring 150 is formed on the surface of the insulating film 102, i.e., the fourth plane S4. The fifth wiring 150 is covered with an insulating film 103. The surface of the insulating film 103 constitutes a fifth plane S5 parallel to the first plane S1, and the sixth wiring 160 is formed on the surface of the insulating film 103, i.e., the fifth plane S5. The sixth wiring 160 is covered with an insulating film 104. As described above, the first to sixth wirings 110, 120, 130, 140, 150 and 160 form a four-layer structure and are stacked on the circuit board 100 so as to overlap one another in the z-direction.

Figure 4:
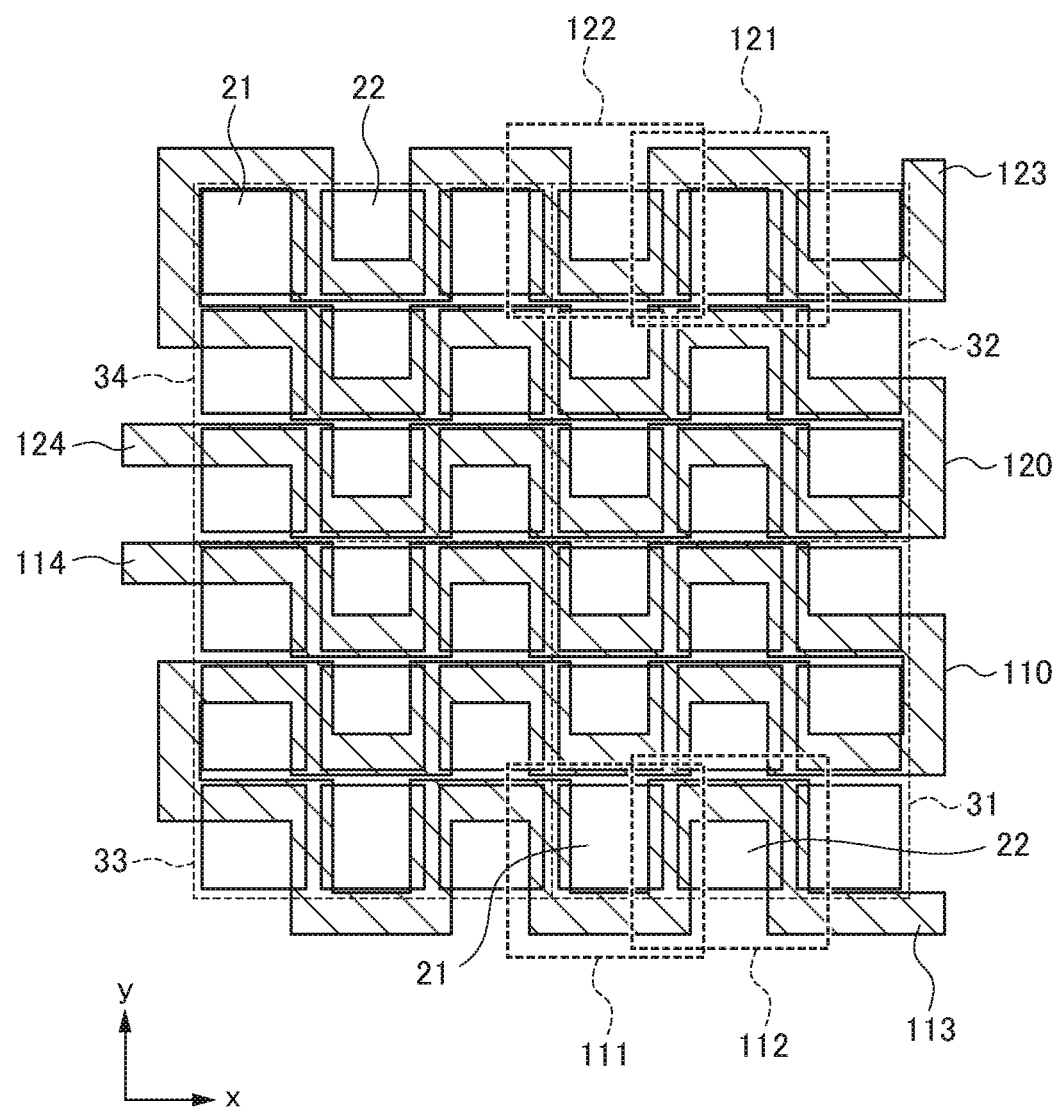
FIG. 4 is a plan view illustrating the first and second wirings 110 and 120.

FIG. 4 is a plan view illustrating the first and second wirings 110 and 120. In FIG. 4, the positions of the first and second magnets 21 and 22 are also illustrated so as to clarify the planar positional relationship with the magnet structure 20. The same applies to the following FIGS. 5 to 8, 11, 12, 14 to 16, 19, 20, 22, and 24.

As illustrated in FIG. 4, the first wiring 110 is a continuously extending wire that covers the first and third areas 31 and 33 of the magnet structure 20 and has a meandering planar shape. More specifically, the first wiring 110 includes a wiring part 111 that partially circles around the first magnet 21 in a plan view and a wiring part 112 that partially circles around the second magnet 22 in a plan view. It is difficult for the first wiring 110 having a meander shape to circle around the entire periphery of the first magnets 21 or second magnets 22, and thus it is often the case that the first wiring 110 makes ½ rounds along the two sides or makes ¾ rounds along the three sides, as illustrated in FIG. 4. The same applies to the second to fourth wirings 120 to 140 to be described later.

When current is made to flow in the first wiring 110, the current circulates in mutually opposite directions in the wiring part 111 and wiring part 112. In the example of FIG. 4, when current is made to flow from one end 113 of the first wiring 110 toward the other end 114, the current flows right-handed (clockwise) in the wiring part 111, while it flows left-handed (counterclockwise) in the wiring part 112. Conversely, when current is made to flow from the other end 114 of the first wiring 110 toward the one end 113, the current flows left-handed (counterclockwise) in the wiring part 111, while it flows right-handed (clockwise) in the wiring part 112.

As illustrated in FIG. 4, the second wiring 120 is a continuously extending wire that covers the second and fourth areas 32 and 34 of the magnet structure 20 and has a meandering planar shape. More specifically, the second wiring 120 includes a wiring part 121 that partially circles around the first magnet 21 in a plan view and a wiring part 122 that partially circles around the second magnet 22 in a plan view.

When current is made to flow in the second wiring 120, the current circulates in mutually opposite directions in the wiring part 121 and wiring part 122. In the example of FIG. 4, when current is made to flow from one end 123 of the second wiring 120 toward the other end 124, the current flows left-handed (counterclockwise) in the wiring part 121, while it flows right-handed (clockwise) in the wiring part 122. Conversely, when current is made to flow from the other end 124 of the second wiring 120 toward the one end 123, the current flows right-handed (clockwise) in the wiring part 121, while it flows left-handed (counterclockwise) in the wiring part 122.

Figure 5:
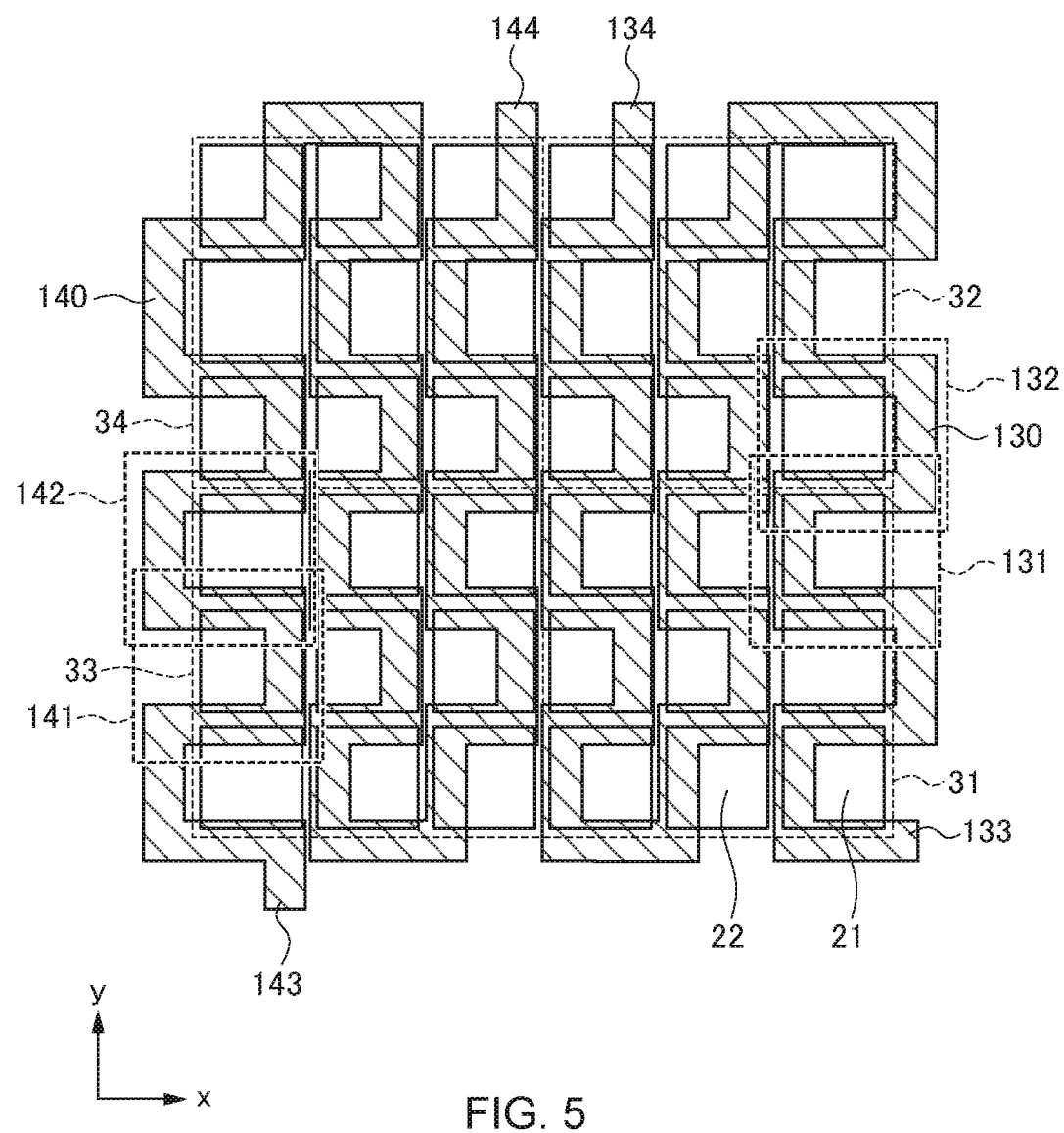
FIG. 5 is a plan view illustrating the third and fourth wirings 130 and 140.

FIG. 5 is a plan view illustrating the third and fourth wirings 130 and 140.

As illustrated in FIG. 5, the third wiring 130 is a continuously extending wire that covers the first and second areas 31 and 32 of the magnet structure 20 and has a meandering planar shape. More specifically, the third wiring 130 includes a wiring part 131 that partially circles around the first magnet 21 in a plan view and a wiring part 132 that partially circles around the second magnet 22 in a plan view.

When current is made to flow in the third wiring 130, the current circulates in mutually opposite directions in the wiring part 131 and wiring part 132. In the example of FIG. 5, when current is made to flow from one end 133 of the third wiring 130 toward the other end 134, the current flows right-handed (clockwise) in the wiring part 131, while it flows left-handed (counterclockwise) in the wiring part 112. Conversely, when current is made to flow from the other end 134 of the third wiring 130 toward the one end 133, the current flows left-handed (counterclockwise) in the wiring part 131, while it flows right-handed (clockwise) in the wiring part 132.

As illustrated in FIG. 5, the fourth wiring 140 is a continuously extending wire that covers the third and fourth areas 33 and 34 of the magnet structure 20 and has a meandering planar shape. More specifically, the fourth wiring 140 includes a wiring part 141 that partially circles around the first magnet 21 in a plan view and a wiring part 142 that partially circles around the second magnet 22 in a plan view.

When current is made to flow in the fourth wiring 140, the current circulates in mutually opposite directions in the wiring part 141 and wiring part 142. In the example of FIG. 5, when current is made to flow from one end 143 of the fourth wiring 140 toward the other end 144, the current flows left-handed (counterclockwise) in the wiring part 141, while it flows right-handed (clockwise) in the wiring part 142. Conversely, when current is made to flow from the other end 144 of the fourth wiring 140 toward the one end 143, the current flows right-handed (clockwise) in the wiring part 141, while it flows left-handed (counterclockwise) in the wiring part 142.

Figure 6:
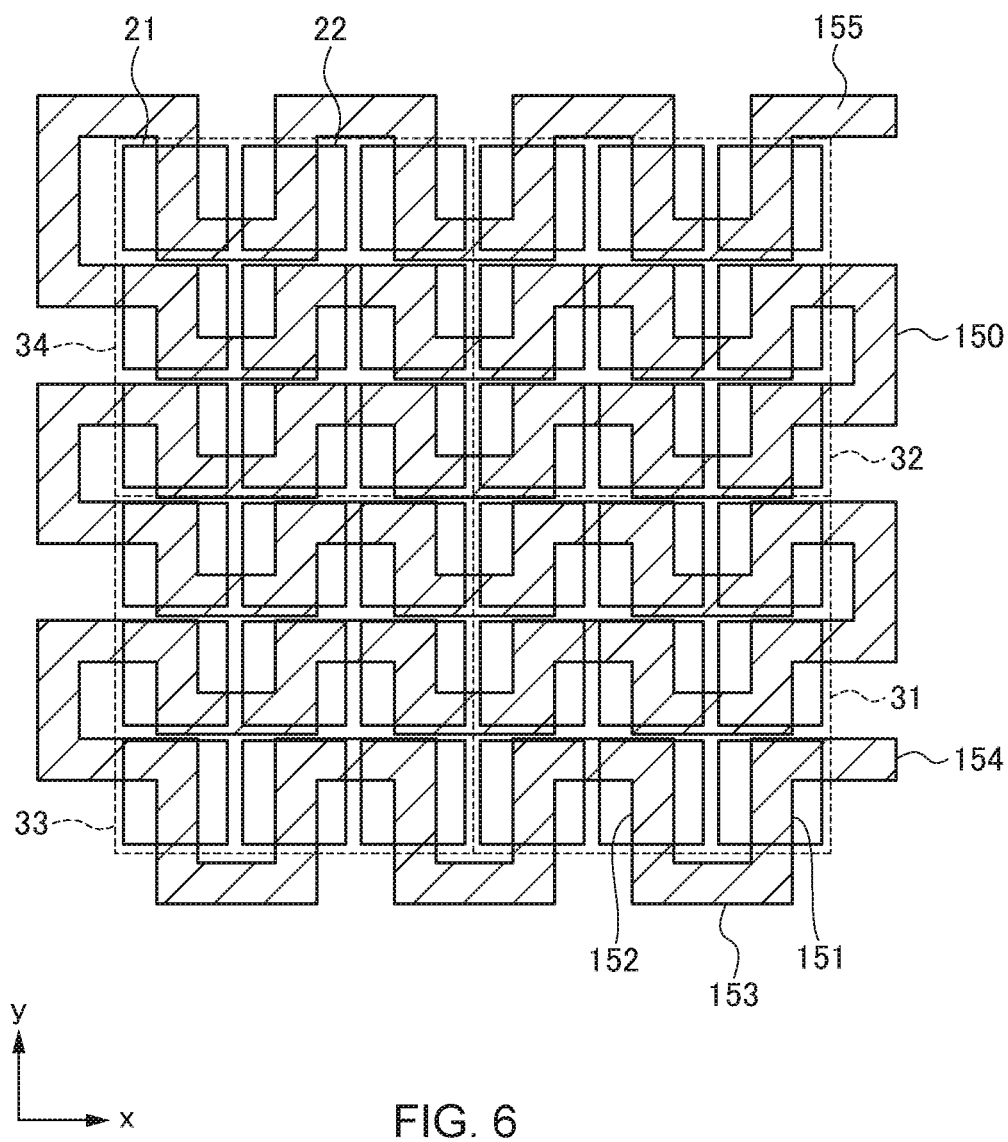
FIG. 6 is a plan view illustrating the fifth wiring 150.

FIG. 6 is a plan view illustrating the fifth wiring 150.

As illustrated in FIG. 6, the fifth wiring 150 is a continuously extending wire that covers the first to fourth areas 31 to 34 of the magnet structure 20 and has a meandering planar shape. More specifically, the fifth wiring 150 includes a wiring part 151 that crosses the first magnet 21 in the y-direction and a wiring part 152 that crosses the second magnet 22 in the y-direction, and a connection part 153 extending in the x-direction so as to connect the wiring parts 151 and 152.

When current is made to flow in the fifth wiring 150, the current flows in mutually opposite directions in the wiring part 151 and wiring part 152. In the example of FIG. 6, when current is made to flow from one end 154 of the fifth wiring 150 toward the other end 155, the current flows downward (negative y-direction) in the wiring part 151, while it flows upward (positive y-direction) in the wiring part 152. Conversely, when current is made to flow from the other end 155 of the fifth wiring 150 toward the one end 154, the current flows upward (positive y-direction) in the wiring part 151, while it flows downward (negative y-direction) in the wiring part 152.

Figure 7:
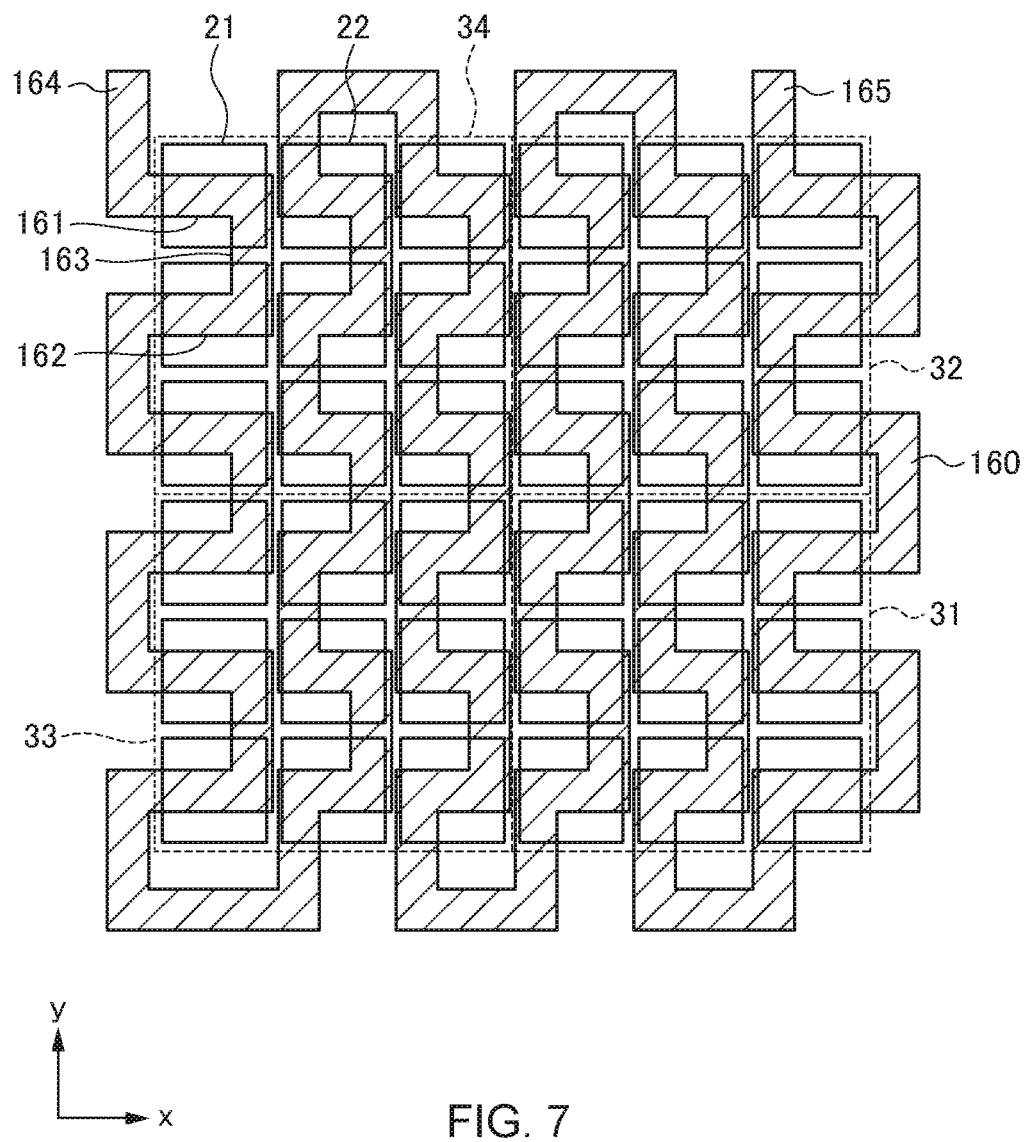
FIG. 7 is a plan view illustrating the sixth wiring 160.

FIG. 7 is a plan view illustrating the sixth wiring 160.

As illustrated in FIG. 7, the sixth wiring 160 is a continuously extending wire that covers the first to fourth areas 31 to 34 of the magnet structure 20 and has a meandering planar shape. More specifically, the sixth wiring 160 includes a wiring part 161 that crosses the first magnet 21 in the x-direction and a wiring part 162 that crosses the second magnet 22 in the x-direction, and a connection part 163 extending in the y-direction so as to connect the wiring parts 161 and 162.

When current is made to flow in the sixth wiring 160, the current flows in mutually opposite directions in the wiring part 161 and wiring part 162. In the example of FIG. 7, when current is made to flow from one end 164 of the sixth wiring 160 toward the other end 165, the current flows rightward (positive x-direction) in the wiring part 161, while it flows leftward (negative x-direction) in the wiring part 162. Conversely, when current is made to flow from the other end 165 of the sixth wiring 160 toward the one end 164, the current flows leftward (negative x-direction) in the wiring part 161, while it flows rightward (positive x-direction) in the wiring part 162.

Figure 8:
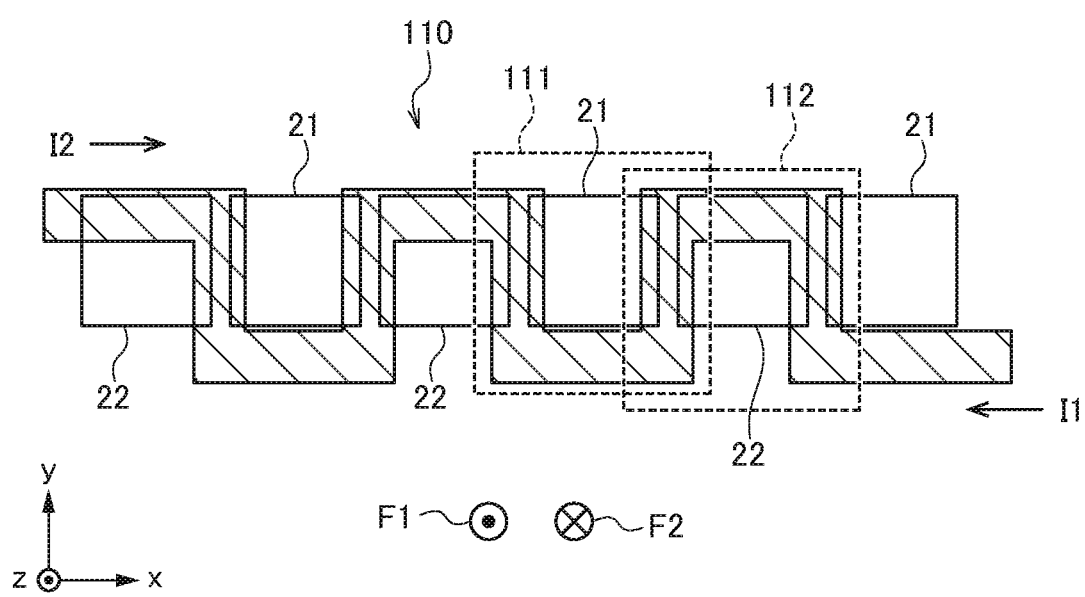
FIG. 8 is a view for explaining the influence that the current flowing in the first wiring 110 has on the magnet structure 20.

FIG. 8 is a view for explaining the influence that the current flowing in the first wiring 110 has on the magnet structure 20.

When a current I1 or I2 flows in the first wiring 110, a magnetic flux penetrating an area surrounded by the wiring part 111 and a magnetic flux penetrating an area surrounded by the wiring part 112 in the z-direction are generated.

Specifically, when the current I1 flows in the first wiring 110, the magnetic flux is generated in the negative z-direction in the area surrounded by the wiring part 111, and the magnetic flux is generated in the positive z-direction in the area surrounded by the wiring part 112. The wiring part 111 is provided so as to circle the first magnet 21 in a plan view and is thus attracted to the first magnet 21, and an upward (positive z-direction) attraction force F1 acts on the first wiring 110. On the other hand, the wiring part 112 is provided so as to circle the second magnet 22 in a plan view and is thus attracted to the second magnet 22, and an upward (positive z-direction) attraction force F1 acts on the first wiring 110. That is, with respect to both the first and second magnets 21 and 22, the upward (positive z-direction) attraction force F1 acts on the first wiring 110.

On the other hand, when the current I2 flows in the first wiring 110, the magnetic flux is generated in the positive z-direction in the area surrounded by the wiring part 111, and the magnetic flux is generated in the negative z-direction in the area surrounded by the wiring part 112. The wiring part 111 is provided so as to circle the first magnet 21 in a plan view and thus repels against the magnetic flux from the first magnet 21, and a downward (negative z-direction) repelling force F2 acts on the first wiring 110. On the other hand, the wiring part 112 is provided so as to circle the second magnet 22 in a plan view and thus repels against the magnetic flux from the second magnet 22, and a downward (negative z-direction) repelling force F2 acts on the first wiring 110. That is, with respect to both the first and second magnets 21 and 22, the downward (negative z-direction) repelling force F2 acts on the first wiring 110.

The first wiring 110 is provided so as to overlap the first and third areas 31 and 33 of the magnet structure 20, so that when the current I1 or I2 is made to flow in the first wiring 110, it is possible to change the relative positional relationship in the z-direction between the first and third areas 31 and 33 of the magnet structure 20 and the first wiring 110. The change rate can be controlled by the magnitude of the current I1 or I2.

Although not illustrated, the same applies to the influence that the current flowing in the second wiring 120 has on the magnet structure 20, and it is possible to change the relative positional relationship in the z-direction between the second and fourth areas 32 and 34 of the magnet structure 20 and the second wiring 120 by the direction and magnitude of the current flowing in the second wiring 120. In the present embodiment, the first and second wirings 110 and 120 are separated from each other so as to allow current to flow therein independently of each other, so that the direction and magnitude of the current flowing in the first wiring 110 and the direction and magnitude of the current flowing in the second wiring 120 can be set individually as desired.

FIG. 9 is a schematic view for explaining an effect brought about by making current flow in the first and second wirings 110 and 120, which illustrate the motion of the circuit board 100 when viewing the circuit board 100 from above through the magnet structure 20.

Figure 9A:
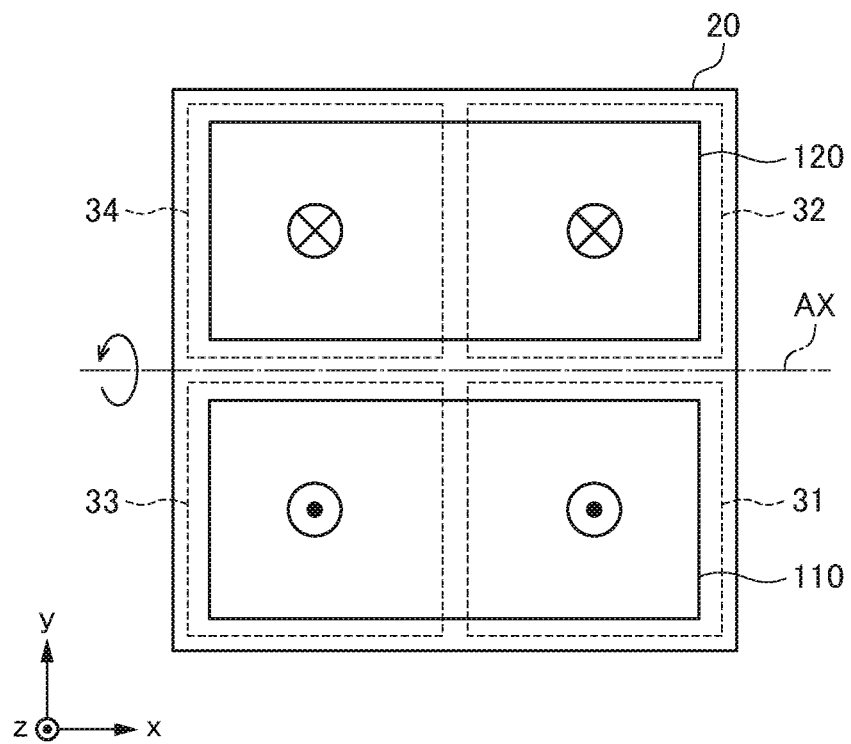
FIGS. 9A and 9B are schematic views for explaining an effect brought about by making current flow in the first and second wirings 110 and 120.

When current is made to flow in the first wiring 110 in a direction in which the attraction force F1 acts and also in the second wiring 120 in a direction in which the repelling force F2 acts, it is possible to relatively rotate (tilt) the magnet structure 20 and circuit board 100 in one direction about an axis AX extending in the x-direction, as illustrated in FIG. 9A. To realize such motion, current is made to flow in the first wiring 110 from the one end 113 thereof illustrated in FIG. 4 toward the other end 114 and also in the second wiring 120 from the one end 123 thereof toward the other end 124.

Figure 9B:
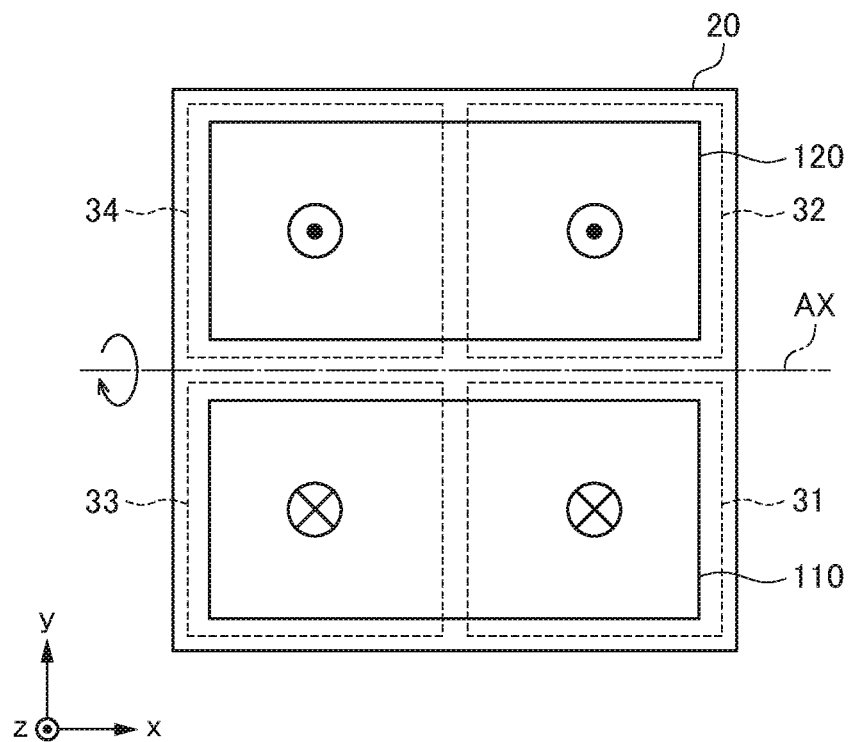

On the other hand, when current is made to flow in the first wiring 110 in a direction in which the repelling force F2 acts and also in the second wiring 120 in a direction in which the attraction force F1 acts, it is possible to relatively rotate (tilt) the magnet structure 20 and circuit board 100 in the direction opposite to the above one direction about the axis AX extending in the x-direction, as illustrated in FIG. 9B. To realize such motion, current is made to flow in the first wiring 110 from the other end 114 thereof illustrated in FIG. 4 toward the one end 113 and also in the second wiring 120 from the other end 124 thereof toward the one end 123.

Although not illustrated, the same applies to the influence that the current flowing in the third and fourth wirings 130 and 140 have on the magnet structure 20. That is, it is possible to change the relative positional relationship in the z-direction between the first and second areas 31 and 32 of the magnet structure 20 and the third wiring 130 by the direction and magnitude of the current flowing in the third wiring 130, and it is possible to change the relative positional relationship in the z-direction between the third and fourth areas 33 and 34 of the magnet structure 20 and the fourth wiring 140 by the direction and magnitude of the current flowing in the fourth wiring 140. In the present embodiment, the third and fourth wirings 130 and 140 are separated from each other so as to allow current to flow therein independently of each other, so that the direction and magnitude of the current flowing in the third wiring 130 and the direction and magnitude of the current flowing in the fourth wiring 140 can be set individually as desired.

FIG. 10 is a schematic view for explaining an effect brought about by making current flow in the third and fourth wirings 130 and 140, which illustrate the motion of the circuit board 100 when viewing the circuit board 100 from above through the magnet structure 20.

Figure 10A:
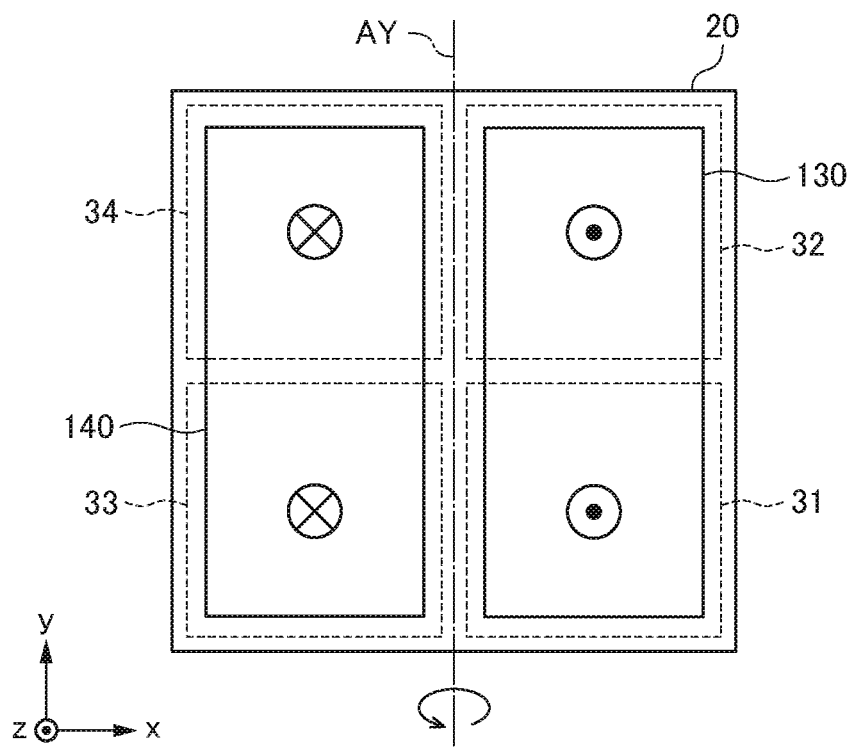
FIG. 10 is a schematic views for explaining an effect brought about by making current flow in the third and fourth wirings 130 and 140.

When current is made to flow in the third wiring 130 in a direction in which the attraction force F1 acts and also in the fourth wiring 140 in a direction in which the repelling force F2 acts, it is possible to relatively rotate (tilt) the magnet structure 20 and circuit board 100 in one direction about an axis AY extending in the y-direction, as illustrated in FIG. 10A. To realize such motion, current is made to flow in the third wiring 130 from the one end 133 thereof illustrated in FIG. 5 toward the other end 134 and also in the fourth wiring 140 from the one end 143 thereof toward the other end 144.

Figure 10B:
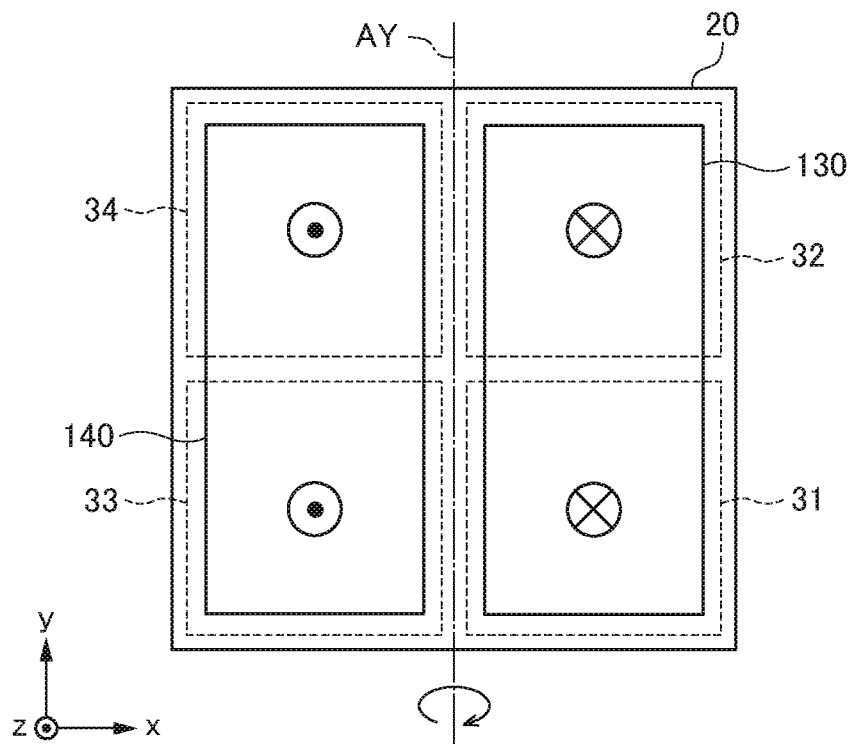

On the other hand, when current is made to flow in the third wiring 130 in a direction in which the repelling force F2 acts, and current is made to flow in the fourth wiring 140 in a direction in which the attraction force F1 acts, it is possible to relatively rotate (tilt) the magnet structure 20 and circuit board 100 in the direction opposite to the above one direction about the axis AY extending in the y-direction, as illustrated in FIG. 10B. To realize such motion, current may be made to flow in the third wiring 130 from the other end 134 thereof illustrated in FIG. 5 toward the one end 133, and current may be made to flow in the fourth wiring 140 from the other end 144 thereof toward the one end 143.

All the first to fourth wirings 110 to 140 are formed on the circuit board 100, so that by controlling the direction and magnitude of the current flowing in each of the first to fourth wirings 110 to 140, it is possible to relatively tilt the magnet structure 20 and circuit board 100 in a desired direction and at a desired angle. For example, when the circuit board 100 is fixed to a predetermined casing, it is possible to tilt the magnet structure 20 in a desired direction and at a desired angle. Conversely, when the magnet structure 20 is fixed to, e.g., a predetermined casing, it is possible to tilt the circuit board 100 in a desired direction and at a desired angle.

Further, when current is made to flow in a direction in which the attraction force F1 or repelling force F2 acts on both the first and second wirings 110 and 120, a gap in the z-direction between the magnet structure 20 and the circuit board 100 can be changed. This can also be realized by making current flow in a direction in which the attraction force F1 or repelling force F2 acts on both the third and fourth wirings 130 and 140.

Figure 11:
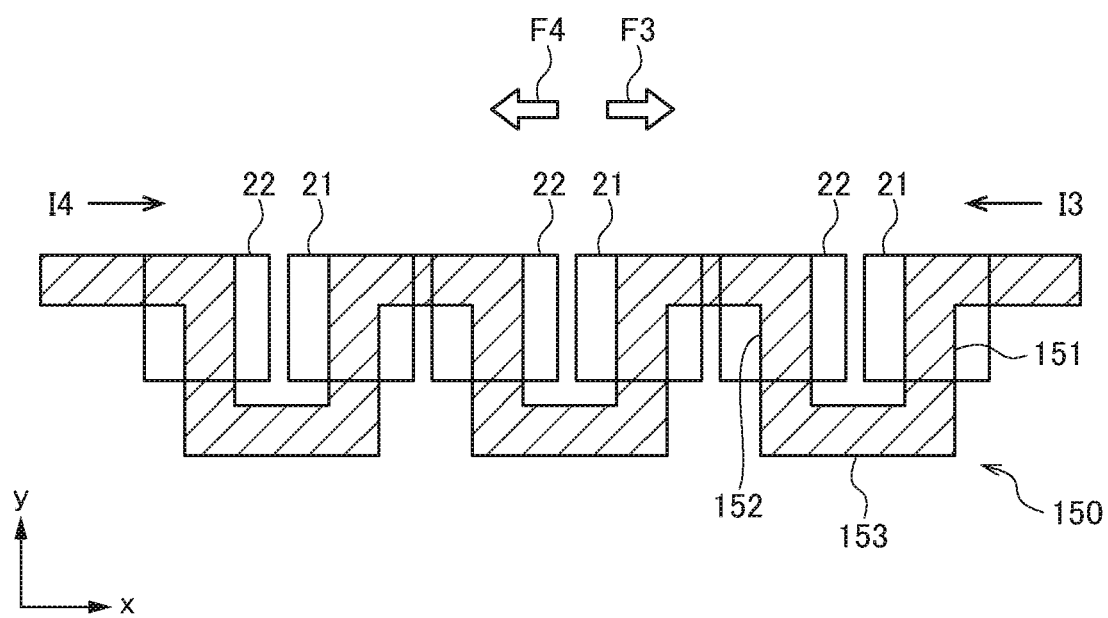
FIG. 11 is a view for explaining the influence that current flowing in the fifth wiring 150 has on the magnet structure 20.

FIG. 11 is a view for explaining the influence that current flowing in the fifth wiring 150 has on the magnet structure 20.

As illustrated in FIG. 11, when a current I3 or I4 flows in the fifth wiring 150, a Lorentz force F3 or F4 in the x-direction acts between the magnet structure 20 and the fifth wiring 150.

Specifically, when the current I3 flows in the fifth wiring 150, it flows downward (in the negative y-direction) with respect to the first magnet 21, so that a rightward (positive x-direction) Lorentz force F3 acts on the fifth wiring 150. On the other hand, the current I3 flows upward (in the positive y-direction) with respect to the second magnet 22, so that the rightward (positive x-direction) Lorentz force F3 acts on the fifth wiring 150. That is, the rightward (positive x-direction) Lorentz force F3 acts on the fifth wiring 150 with respect to both the first and second magnets 21 and 22.

On the other hand, when the current I4 flows in the fifth wiring 150, it flows upward (in the positive y-direction) with respect to the first magnet 21, so that a leftward (negative x-direction) Lorentz force F4 acts on the fifth wiring 150. On the other hand, the current I4 flows downward (in the negative y-direction) with respect to the second magnet 22, so that the leftward (negative x-direction) Lorentz force F4 acts on the fifth wiring 150. That is, the leftward (negative x-direction) Lorentz force F4 acts on the fifth wiring 150 with respect to both the first and second magnets 21 and 22.

Thus, when the current I3 or I4 is made to flow in the fifth wiring 150, it is possible to change the relative positional relationship in the x-direction between the magnet structure 20 and the fifth wiring 150. The change rate can be controlled by the magnitude of the current I3 or I4.

Figure 12:
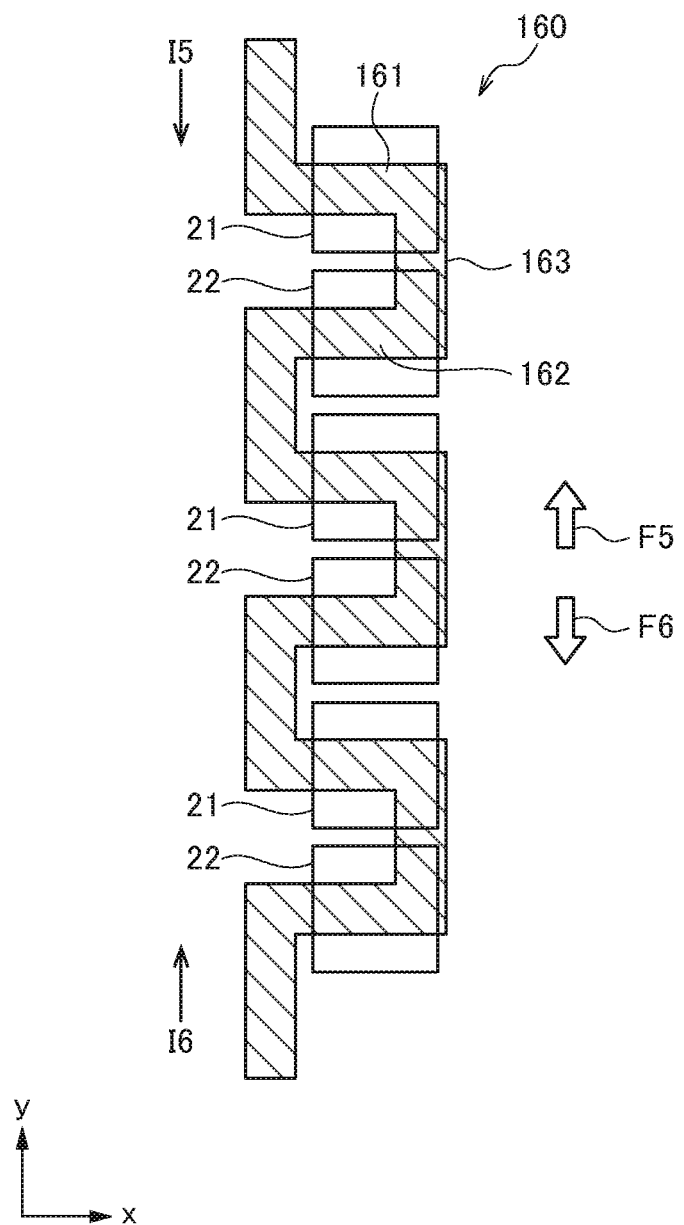
FIG. 12 is a view for explaining the influence that current flowing in the sixth wiring 160 has on the magnet structure 20.

FIG. 12 is a view for explaining the influence that current flowing in the sixth wiring 160 has on the magnet structure 20.

As illustrated in FIG. 12, when a current I5 or I6 flows in the sixth wiring 160, a Lorentz force F5 or F6 in the y-direction acts between the magnet structure 20 and the sixth wiring 160.

Specifically, when the current I5 flows in the sixth wiring 160, it flows rightward (in the positive x-direction) with respect to the first magnet 21, so that an upward (positive y-direction) Lorentz force F5 acts on the sixth wiring 160. On the other hand, the current I5 flows leftward (in the negative x-direction) with respect to the second magnet 22, so that the upward (positive y-direction) Lorentz force F5 acts on the sixth wiring 160. That is, the upward (positive y-direction) Lorentz force F5 acts on the sixth wiring 160 with respect to both the first and second magnets 21 and 22.

On the other hand, when the current I6 flows in the sixth wiring 160, it flows leftward (in the negative x-direction) with respect to the first magnet 21, so that a downward (negative y-direction) Lorentz force F6 acts on the sixth wiring 160. On the other hand, the current I6 flows rightward (in the positive x-direction) with respect to the second magnet 22, so that the downward (negative y-direction) Lorentz force F6 acts on the sixth wiring 160. That is, the downward (negative y-direction) Lorentz force F6 acts on the sixth wiring 160 with respect to both the first and second magnets 21 and 22.

Thus, when the current I5 or I6 is made to flow in the sixth wiring 160, it is possible to change the relative positional relationship in the y-direction between the magnet structure 20 and the sixth wiring 160. The change rate can be controlled by the magnitude of the current I5 or I6.

Both the fifth and sixth wirings 150 and 160 are formed on the circuit board 100, so that it is possible to change the planar positional relationship between the magnet structure 20 and the circuit board 100 by controlling the currents I3 to I6. Thus, when the circuit board 100 is fixed to a predetermined casing, it is possible to drive the magnet structure 20 along the XY plane by controlling the currents I3 to I6. Conversely, when the magnet structure 20 is fixed to a predetermined casing, it is possible to drive the circuit board 100 along the XY plane by controlling the currents I3 to I6.

Although not particularly limited, the actuator 10A according to the present embodiment can be used as an actuator for shake correction of a camera incorporated in a smartphone. In this case, one of the magnet structure 20 and circuit board 100 is fixed to the casing of the smartphone, and the other one thereof is fixed to an optical lens or an image sensor, and a camera-shake signal obtained by an acceleration sensor incorporated in the smartphone is converted into the currents I1 to I6, whereby it is possible to drive the optical lens or image sensor in accordance with the direction, angle and magnitude of a camera-shake so as to cancel the camera-shake. Further, by making current flow in a direction in which the attraction force F1 or repelling force F2 acts on both the first and second wirings 110 and 120 (or both the third and fourth wirings 130 and 140), it is possible to realize a camera's auto-focus function.

FIG. 13 is a process view for explaining a manufacturing method for the magnet structure 20.

Figure 13A:
FIGS. 13A-13F are process views for explaining a manufacturing method for the magnet structure 20.

First, as illustrated in FIG. 13A, a magnet 20a is formed on the support substrate 23 made of glass or the like. The magnet 20a may be a thin film magnet produced by sputtering, a thick film magnet produced by plating or electrodeposition, or a magnet obtained by bonding bulk magnets such as a sintered magnet or bonded magnet. Although not particularly limited, the magnet 20a is preferably an anisotropic neodymium magnet in terms of magnetic characteristics. The magnetization easy axis of the magnet 20a is the thickness direction (z-axis) thereof. The thickness of the magnet 20a is restricted by a device into which the actuator 10A according to the present embodiment is incorporated. For example, in applications where an optical lens is driven for shake correction of a camera incorporated in a smartphone, the actuator 10A needs to be very thin, so that the magnet 20a inevitably needs to be thin. In such applications, the thickness of the magnet 20a is restricted to 1 mm or less, e.g., about 500 µm. The magnet 20a may undergo surface deterioration due to oxidation or processing strain, which may in turn deteriorate magnetic characteristics, so that when the thickness of the magnet is reduced, deterioration of the magnet needs to be suppressed by, e.g., providing a protective layer on the surface of the magnet.

Figure 13B:
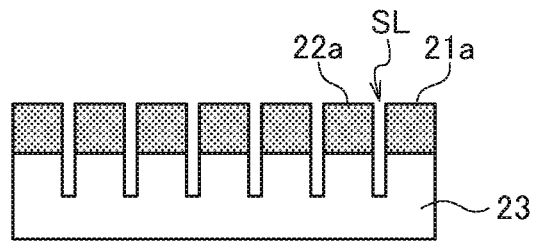

Then, as illustrated in FIG. 13B, slits SL are formed in the magnet 20a to divide the magnet 20a into a plurality of blocks 21a and 22a which are to become the first and second magnets 21 and 22, respectively. The slit SL is formed for the purpose of suppressing, in alternate magnetization utilizing local heating by laser beam to be described later, undesired diffusion of heat caused by the laser beam to neighboring regions. Thus, when the undesired heat diffusion to neighboring regions does not occur for the reason that heat diffusion to the support substrate is dominant owing to small thickness of the magnet 20a, the slit SL is not necessary. That is, the slit SL is useful when a sintered magnet is bonded to the support substrate. The slit SL may be formed by dicing or wire electric-discharge machining. The slit SL preferably has a depth reaching the surface layer of the support substrate 23 so as to fairly separate the blocks 21a and 22a from each other. Even when the slit SL is not formed, regions whose magnetization directions formed in the alternate magnetization utilizing local heating by the laser beam to be described later are antiparallel are referred to as the block 21a and block 21b. Although not particularly limited, the size of the blocks 21a and 22a is preferably as small as possible in order to obtain a stronger magnetic force by reducing influences of a demagnetizing field. However, as described above, the surface layer part of the magnet 20a has a low coercive force, so that when the magnet 20a is too finely divided by the slits SL, the coercive force is reduced instead. Considering this, the size of the blocks 21a and 22a is preferably almost the same as the thickness of the magnet 20a. That is, the aspect ratio of the blocks 21a and 22a is preferably about 0.1 to 10 and, more preferably, about 1. For example, when the thickness of the magnet 20a is about 500 µm, the dimensions in both the x- and y-directions may be set to about 500 µm. Thus, the magnet 20a is divided into the blocks 21a and 22a each of which is a cube having a size of 500 µm×500 µm.

Figure 13C:
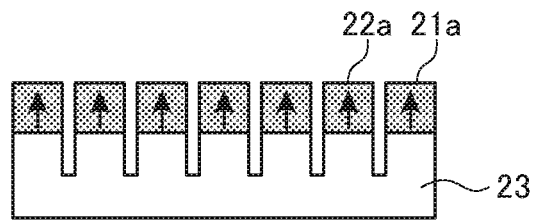

Then, as illustrated in FIG. 13C, the plurality of blocks 21a and 22a are magnetized in the z-direction. The magnetization is preferably performed by application of a pulse magnetic field until the blocks 21a and 22a are magnetically saturated.

Figure 13D:
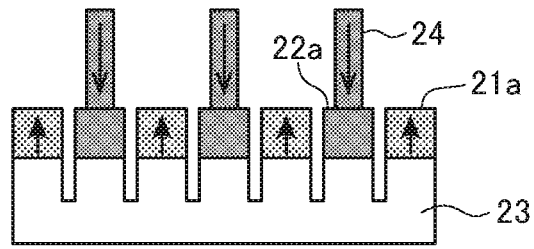

Then, as illustrated in FIG. 13D, laser beam 24 is selectively irradiated onto the block 22a to become the second magnet 22 for local heating to reduce the coercive force of the block 22a. Although the heat given by the laser beam 24 is conducted to the block 21a to become the first magnet 21 to some degree, less heat is conducted in a planar direction by the function of the slits SL. When a material, such as glass, having a lower thermal diffusivity than that of a sintered magnet is used as the material of the support substrate 23, heat conduction through the support substrate 23 can be minimized. Thus, it is possible to selectively reduce the coercive force of the block 22a while maintaining the coercive force of the block 21a.

Figure 13E:
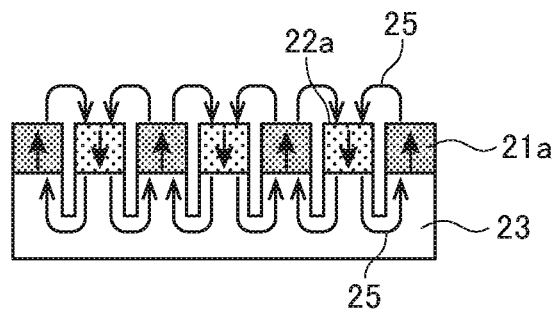
Figure 13F:
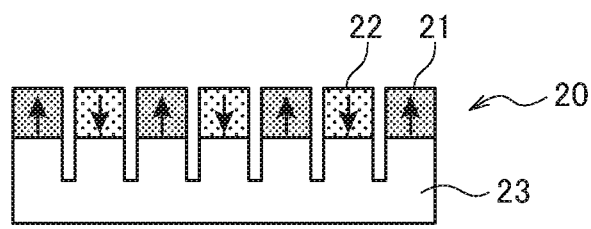

After natural cooling, as illustrated in FIG. 13E, leakage magnetic flux 25 from the block 21a passes through the block 22a to magnetize the block 22a in the opposite direction. As a result, alternate magnetization is achieved to thereby obtain the magnet structure 20 in which the first and second magnets 21 and 22 are alternately arranged as illustrated in FIG. 13F.

Then, the magnet structure 20 and circuit board 100 are supported so as to be swingable and to be slidable in the planar direction such that the first plane S1 of the magnet structure 20 faces the second to fifth planes S2 to S5 of the circuit board 100, whereby the actuator 10A according to the present embodiment is completed.

As described above, the actuator 10A according to the present embodiment is constituted by the magnet structure 20 provided on the support substrate 23, planar first to sixth wirings 110, 120, 130, 140, 150 and 160 provided on the circuit board 100 and can thus perform rotational motion about the x- and y-axes and two-dimensional motion while having a very small thickness.

Figure 14:
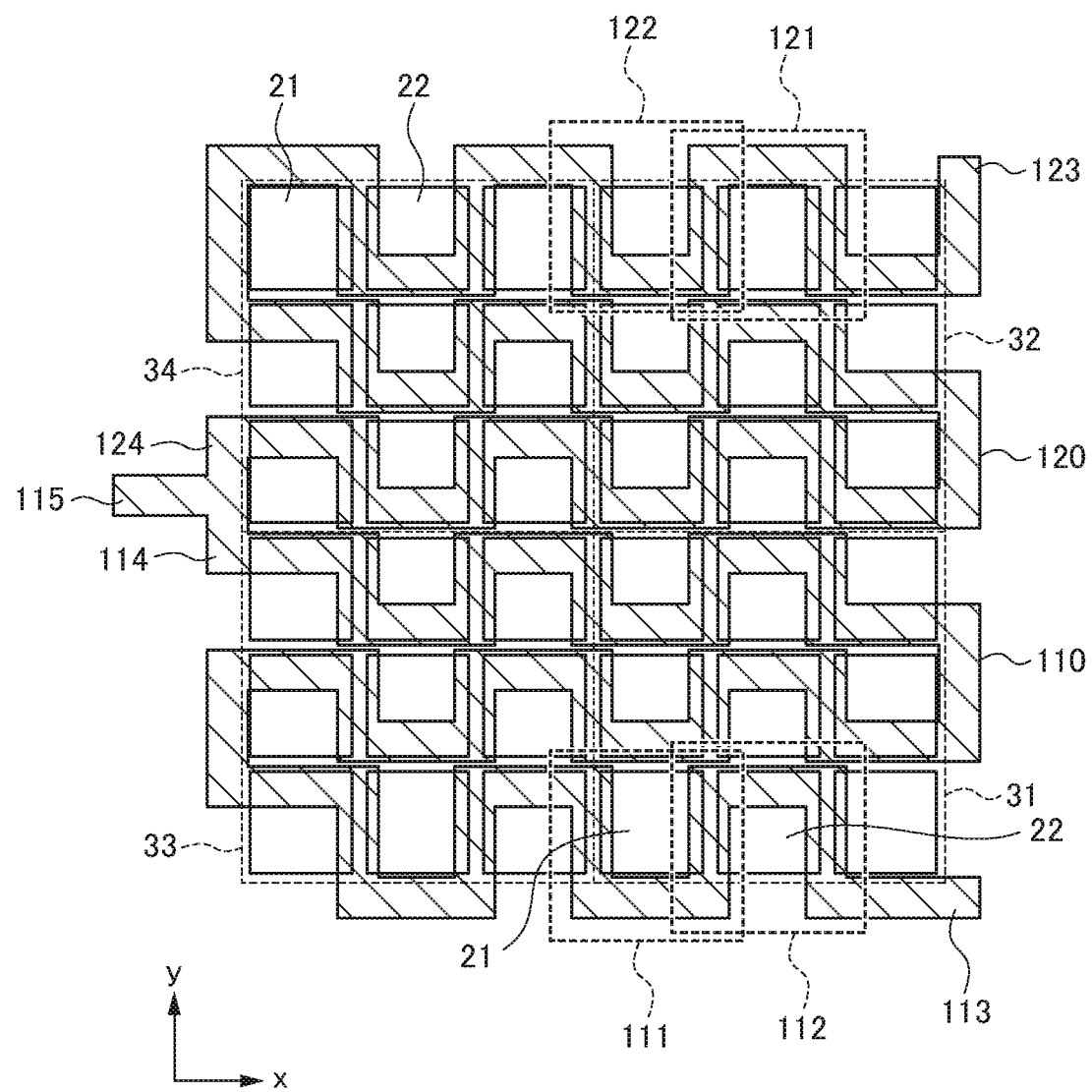
FIG. 14 is a plan view illustrating the configuration of the first and second wirings 110 and 120 according to a first modification.

FIG. 14 is a plan view illustrating the configuration of the first and second wirings 110 and 120 according to the first modification.

In the first modification illustrated in FIG. 14, the other end 114 of the first wiring 110 and the other end 124 of the second wiring 120 are short-circuited, and a terminal 115 is connected to the short-circuited portion. Thus, when current is made to flow from the one end 113 of the first wiring 110 and one end 123 of the second wiring 120 to the terminal 115, the motion illustrated in FIG. 9A can be realized. Conversely, when current is made to flow from the terminal 115 to the one end 113 of the first wiring 110 and one end 123 of the second wiring 120, the motion illustrated in FIG. 9B can be realized. Further, when current is made to flow in the first and second wirings 110 and 120 with the terminal 115 opened, a gap in the z-direction between the magnet structure 20 and the circuit board 100 can be changed.

According to the first modification, although it becomes difficult to control the current flowing in the first wiring 110 and the current flowing in the second wiring 120 in a completely independent manner, the number of terminals can be reduced. Although not illustrated, the third and fourth wirings 130 and 140 can be modified in the same way.

Figure 15:
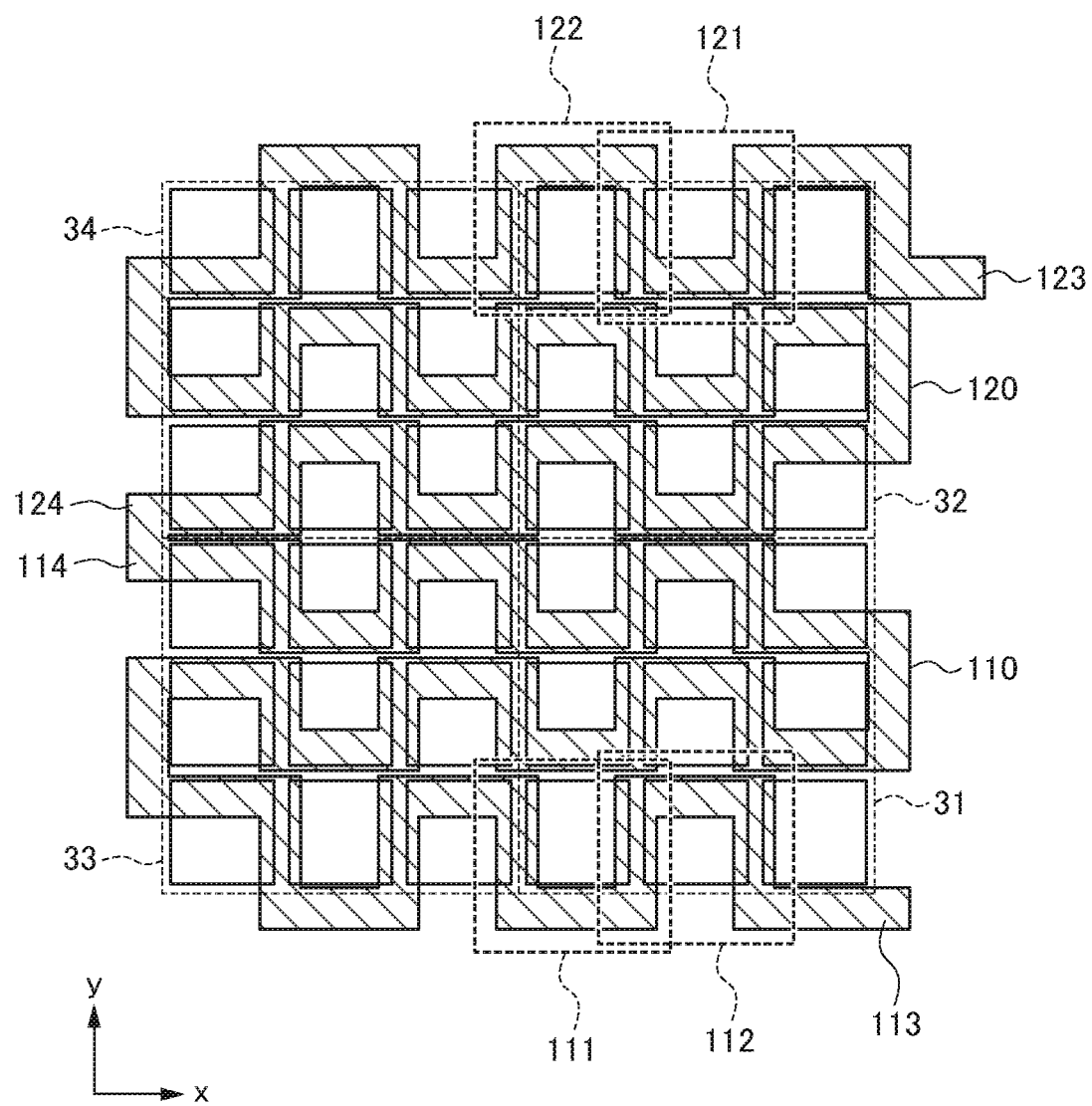
FIG. 15 is a plan view illustrating the configuration of the first and second wirings 110 and 120 according to a second modification.

FIG. 15 is a plan view illustrating the configuration of the first and second wirings 110 and 120 according to the second modification.

In the second modification illustrated in FIG. 15, the other end 114 of the first wiring 110 and the other end 124 of the second wiring 120 are short-circuited, and the meander shape of the second wiring 120 is shifted in the x-direction by one pitch from that illustrated in FIG. 4. Thus, the wiring part 121 included in the second wiring 120 circles around the first magnet 21 in the direction opposite to the wiring part 121 in FIG. 4, and the wiring part 122 included in the second wiring 120 circles around the second magnet 22 in the direction opposite to the wiring part 122 in FIG. 4. Unlike the first modification, a terminal is not provided at the connection portion between the first and second wirings 110 and 120.

Thus, when current is made to flow from the one end 113 of the first wiring 110 to the one end 123 of the second wiring 120, the motion illustrated in FIG. 9A can be realized. Conversely, when current is made to flow from the one end 123 of the second wiring 120 to the one end 113 of the first wiring 110, the motion illustrated in FIG. 9B can be realized. According to the second modification, although it is impossible to change a gap in the z-direction between the magnet structure 20 and the circuit board 100, the number of terminals can be reduced further. Although not illustrated, the third and fourth wirings 130 and 140 can be modified in the same way.

Figure 16:
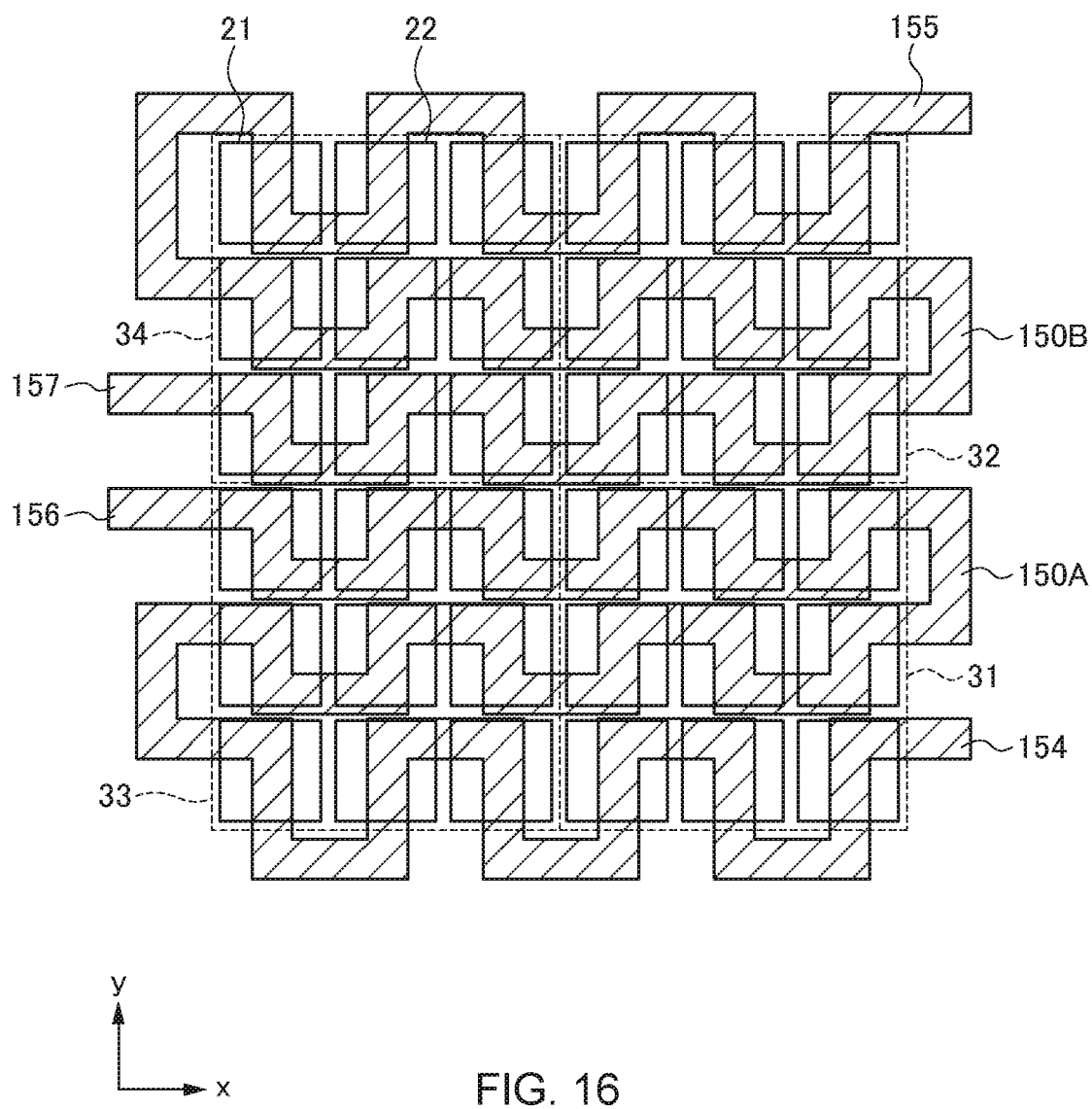
FIG. 16 is a plan view illustrating the configuration of the fifth wiring 150 according to a third modification.

FIG. 16 is a plan view illustrating the configuration of the fifth wiring 150 according to the third modification.

In the third modification illustrated in FIG. 16, the fifth wiring 150 is cut in the middle thereof into a first part 150A that covers the first and third areas 31 and 33 and a second part 150B that covers the second and fourth areas 32 and 34. This allows current to flow in the first and second parts 150A and 150B independently of each other.

Figure 17A:
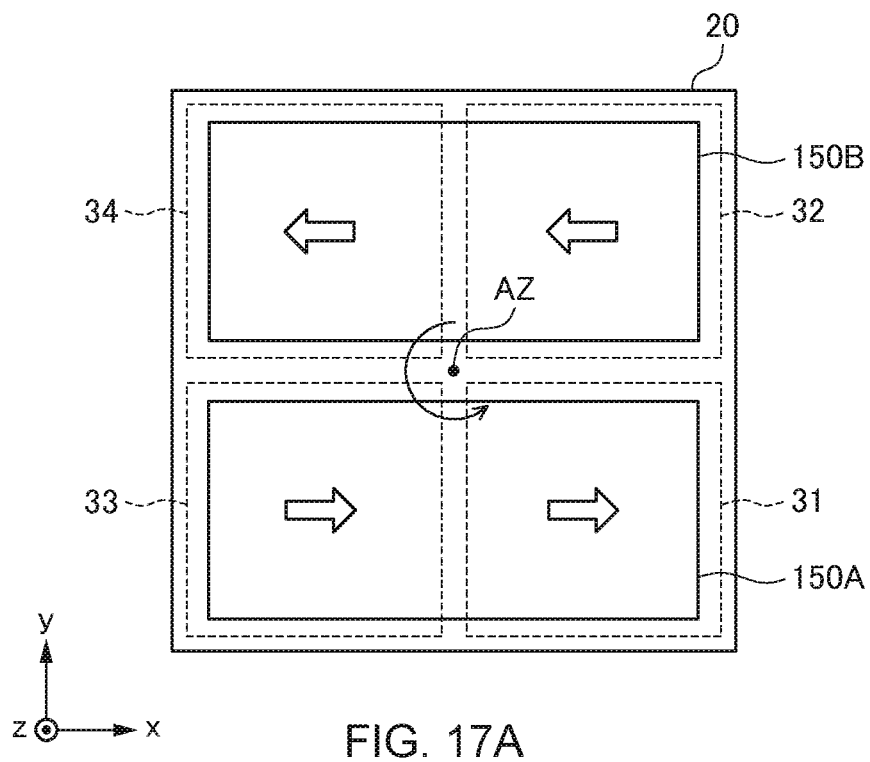
FIGS. 17A and 17B are schematic views for explaining an effect brought about by making current flow in the first and second parts 150A and 150B of the fifth wiring 150.

When current is made to flow from the one end 154 of the first part 150A to the other end 156 and also from the other end 155 of the second part 150B to one end 157, a rightward Lorentz force acts on the first and third areas 31 and 33 of the magnet structure 20, and a leftward Lorentz force acts on the second and fourth areas 32 and 34 of the magnet structure 20, as illustrated in FIG. 17A. This allows the magnet structure 20 and circuit board 100 to be relatively rotated in one direction about an axis AZ extending in the z-direction.

Figure 17B:
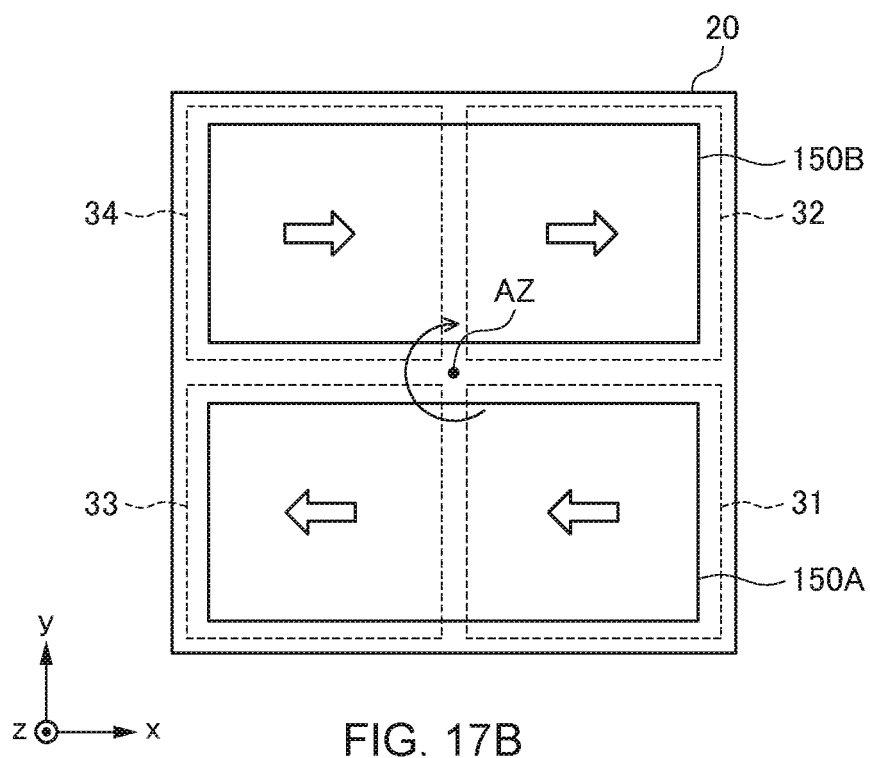

On the other hand, when current is made to flow from the other end 156 of the first part 150A to the one end 154 and also from the one end 157 of the second part 150B to the other end 155, a leftward Lorentz force acts on the first and third areas 31 and 33 of the magnet structure 20, and a rightward Lorentz force acts on the second and fourth areas 32 and 34 of the magnet structure 20, as illustrated in FIG. 17B. This allows the magnet structure 20 and circuit board 100 to be relatively rotated in the direction opposite to the above one direction about the axis AZ extending in the z-direction.

As described above, according to the third modification, it is possible to relatively rotate the magnet structure 20 and circuit board 100 about the axis AZ extending in the z-direction. As a matter of course, when current is made to flow in the first and second parts 150A and 150B in the same direction, it is possible to change the relative positional relationship in the x-direction between the magnet structure 20 and the circuit board 100. Although not illustrated, the sixth wiring 160 can be modified in the same way.

Second Embodiment

Figure 18:
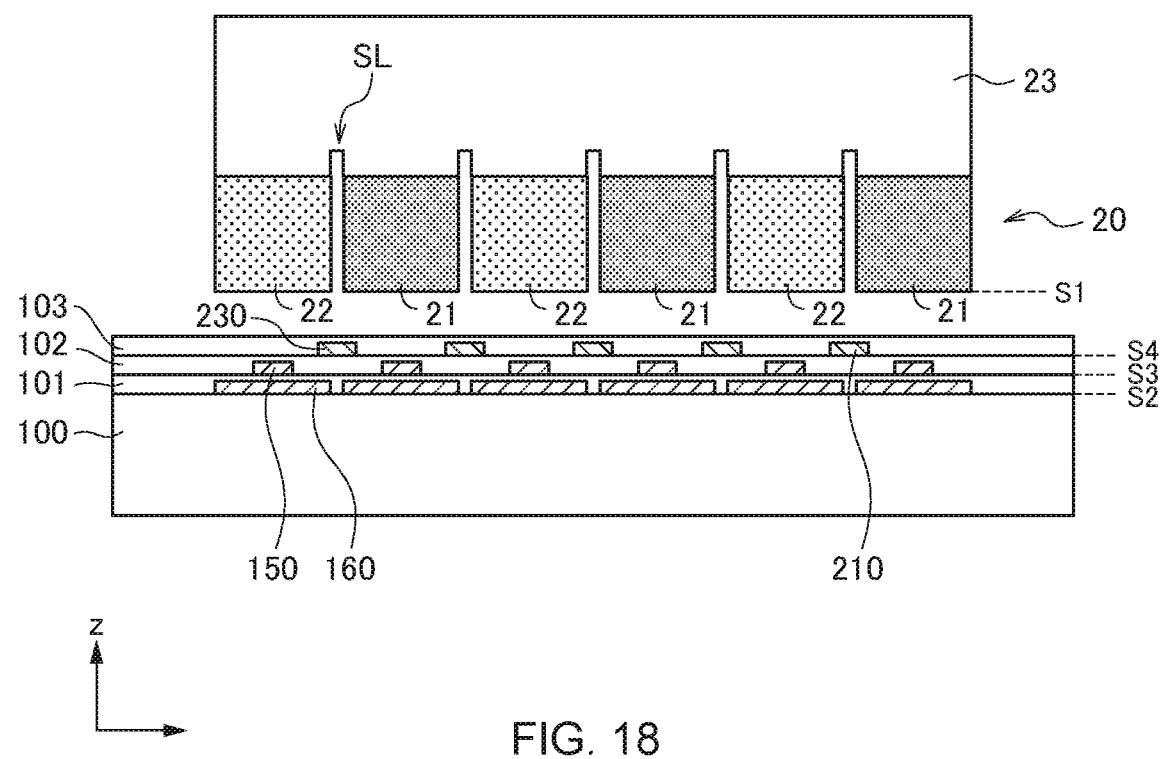
FIG. 18 is a schematic cross-sectional view illustrating the configuration of the main part of an actuator 10B according to a second embodiment of the present invention.

FIG. 18 is a schematic cross-sectional view illustrating the configuration of the main part of an actuator 10B according to the second embodiment of the present invention.

Figure 19:
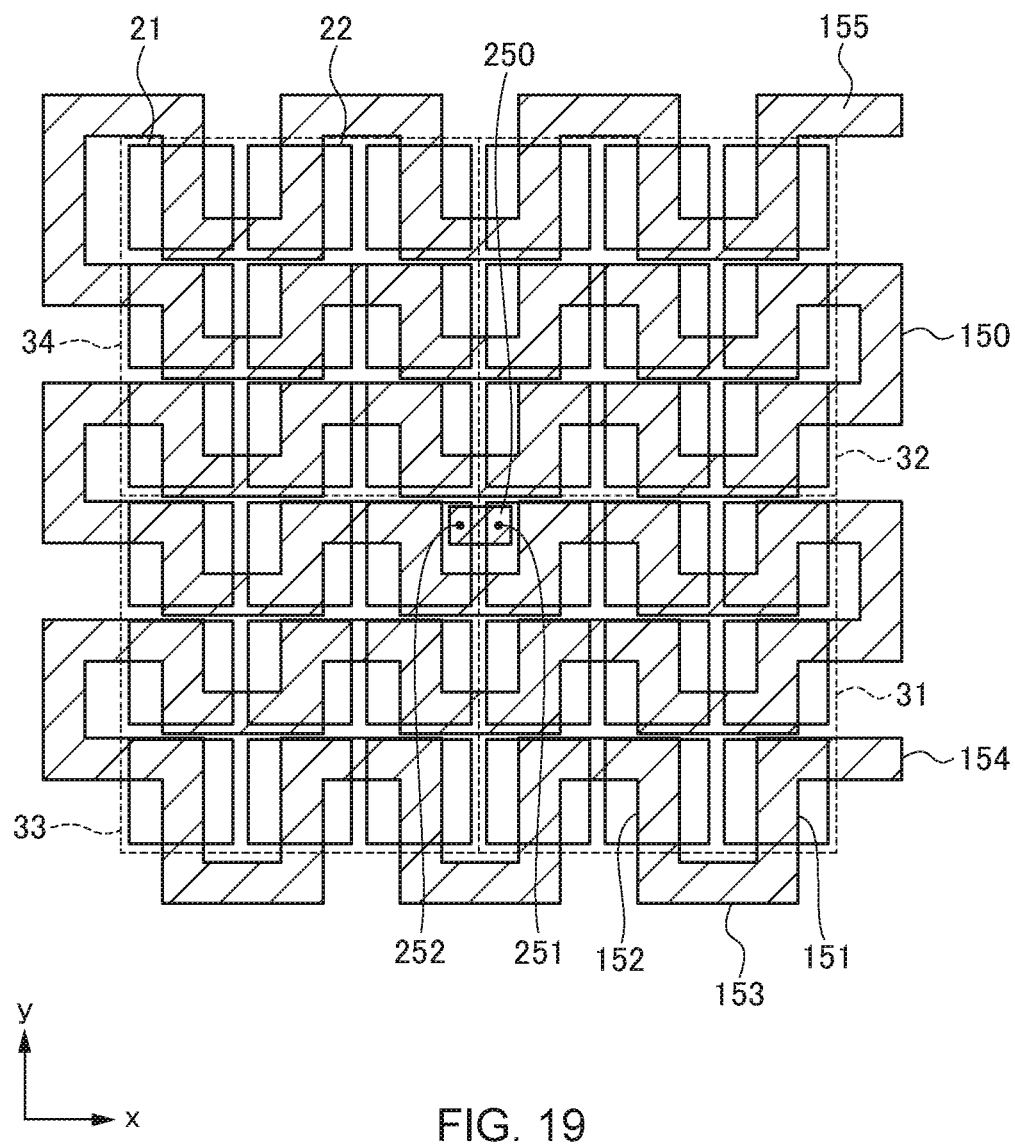
FIG. 19 is a plan view illustrating the configuration of the fifth wiring 150 according to the second embodiment.
Figure 20:
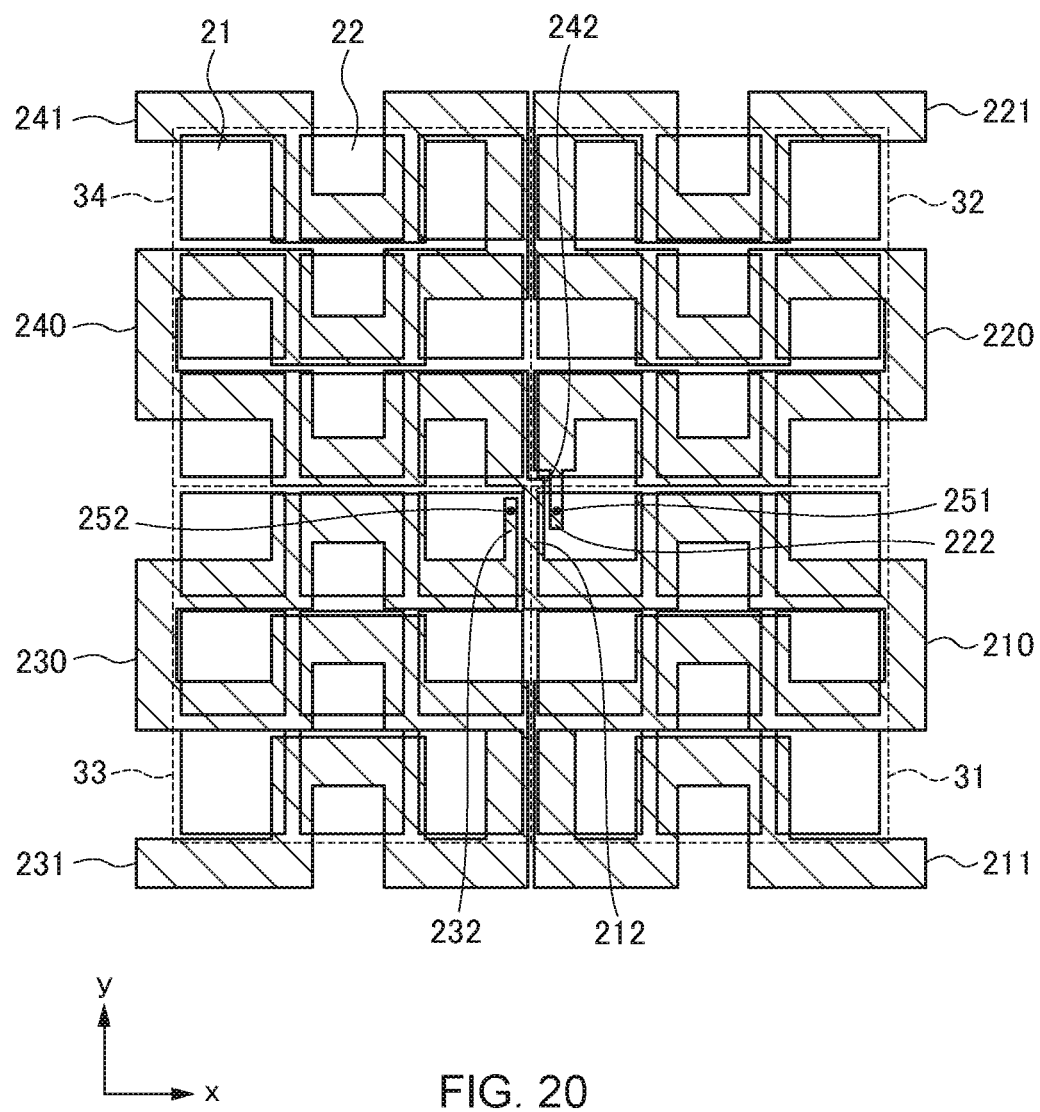
FIG. 20 is a plan view illustrating the configuration of the first to fourth wirings 210, 220, 230, and 240.

As illustrated in FIG. 18, in the actuator 10B according to the present embodiment, the wiring layer provided on the circuit board 100 has a three-layer structure. Specifically, the sixth wiring 160 illustrated in FIG. 7 is formed on the second plane S2 of the circuit board 100, the fifth wiring 150 illustrated in FIG. 19 is formed on the third plane S3, and the first to fourth wirings 210, 220, 230 and 240 illustrated in FIG. 20 are formed on the fourth plane S4. Other configurations are the same as those of the actuator 10A according to the first embodiment, so the same reference numerals are given to the same elements, and overlapping description will be omitted.

As illustrated in FIG. 19, in the present embodiment, a connection wiring 250 is added to the same wiring layer as that of the fifth wiring 150. The connection wiring 250 is provided at the center portion that does not interfere with the fifth wiring 150 and connected to the second and third wirings 220 and 230 located in the upper layer thereof through through hole conductors 251 and 252 penetrating the insulating film 102.

FIG. 20 is a plan view illustrating the configuration of the first to fourth wirings 210, 220, 230 and 240.

As illustrated in FIG. 20, the first to fourth wirings 210, 220, 230 and 240 are provided so as to cover the first to fourth areas 31 to 34 of the magnet structure 20. One ends 211, 221, 231 and 241 of the respective first to fourth wirings 210, 220, 230 and 240 each constitute a terminal. The other end 212 of the first wiring 210 and the other end 242 of the fourth wiring 240 are short-circuited, whereby the first and fourth wirings 210 and 240 are made into one continuous wiring. The other end 222 of the second wiring 220 and the other end 232 of the third wiring 230 are short-circuited through the through hole conductor 251, connection wiring 250 and through hole conductor 252.

The first wiring 210 is formed into a meander shape that covers the first area 31 and, when current is made to flow from the one end 211 thereof to the other end 212, the current flows right-handed (clockwise) on the first magnet 21, while it flows left-handed (counterclockwise) on the second magnet 22. The second wiring 220 is formed into a meander shape that covers the second area 32 and, when current is made to flow from the one end 221 thereof to the other end 222, the current flows right-handed (clockwise) on the first magnet 21, while it flows left-handed (counterclockwise) on the second magnet 22. The third wiring 230 is formed into a meander shape that covers the third area 33 and, when current is made to flow from the one end 231 thereof to the other end 232, the current flows right-handed (clockwise) on the first magnet 21, while it flows left-handed (counterclockwise) on the second magnet 22. The fourth wiring 240 is formed into a meander shape that covers the fourth area 34 and, when current is made to flow from the one end 241 thereof to the other end 242, the current flows right-handed (clockwise) on the first magnet 21, while it flows left-handed (counterclockwise) on the second magnet 22.

The other end 212 of the first wiring 210 and the other end 242 of the fourth wiring 240 are short-circuited as described above, so that when current is made to flow from the one end 211 of the first wiring 210 toward the other end 212, the current flows from the other end 242 of the fourth wiring 240 toward the one end 241. Thus, as illustrated in FIGS. 9A and 10A, the attraction force F1 acts on the first area 31, and the repelling force F2 acts on the fourth area 34. Conversely, when current is made to flow from the one end 241 of the fourth wiring 240 toward the one end 211 of the first wiring 210, the repelling force F2 acts on the first area 31, and the attraction force F1 acts on the fourth area 34, as illustrated in FIGS. 9A and 10A.

The other end 222 of the second wiring 220 and the other end 232 of the third wiring 230 are short-circuited as described above, so that when current is made to flow from the one end 221 of the second wiring 220 toward the other end 222, the current flows from the other end 232 of the third wiring 230 toward the one end 231. Thus, as illustrated in FIGS. 9B and 10A, the attraction force F1 acts on the second area 32, and the repelling force F2 acts on the third area 33. Conversely, when current is made to flow from the one end 231 of the third wiring 230 toward the one end 221 of the second wiring 220, the repelling force F2 acts on the second area 32, and the attraction force F1 acts on the third area 33, as illustrated in FIGS. 9A and 10B.

Thus, it is possible to freely perform rotation about the axis AX extending in the x-direction and rotation about the axis AY extending in the y-direction according to the direction and magnitude of the current flowing in each of the first to fourth wirings 210, 220, 230 and 240. That is, it is possible to realize the same rotational motion as that of the actuator 10A according to the first embodiment while reducing the number of the wiring layers to be formed on the circuit board 100.

Third Embodiment

Figure 21:
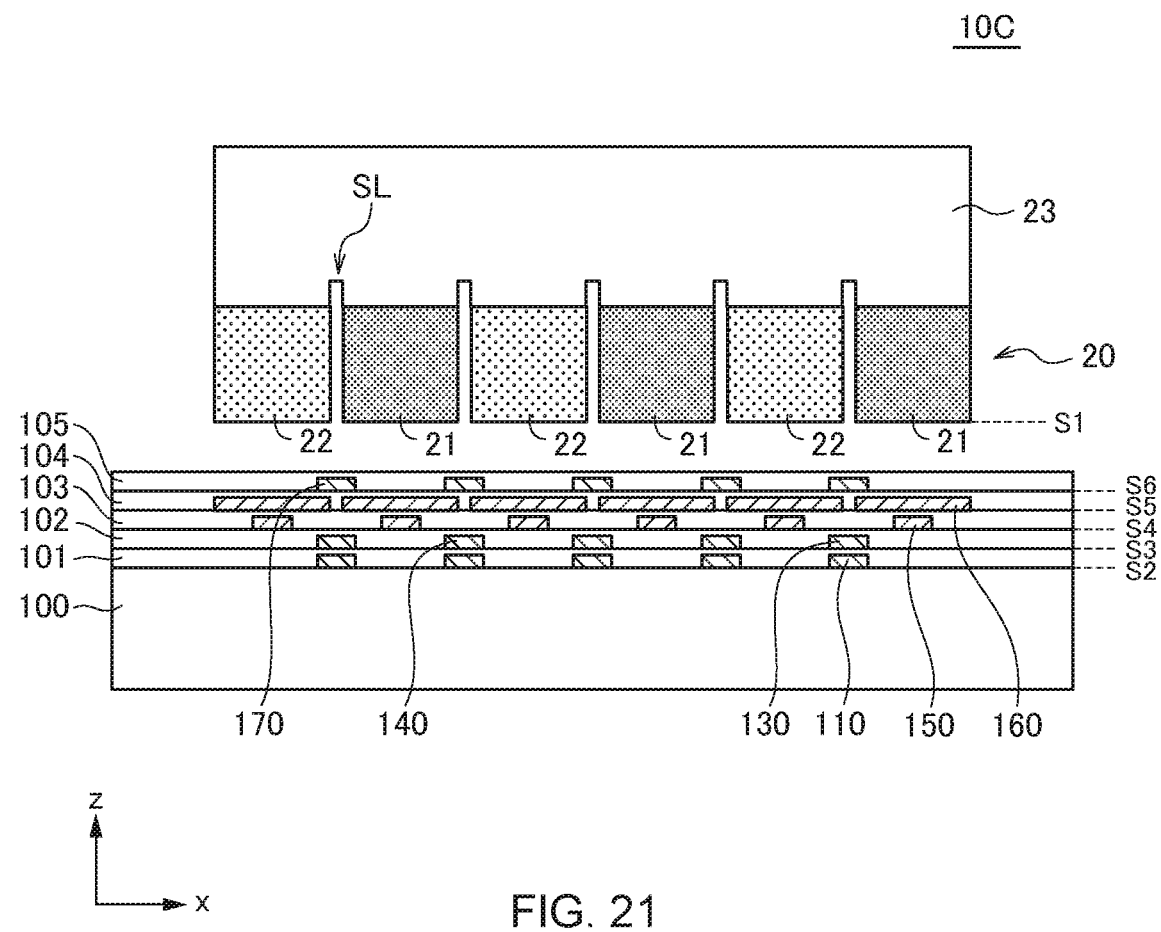
FIG. 21 is a schematic cross-sectional view illustrating the configuration of the main part of an actuator 10C according to a third embodiment of the present invention.

FIG. 21 is a schematic cross-sectional view illustrating the configuration of the main part of an actuator 10C according to the third embodiment of the present invention.

As illustrated in FIG. 21, in the actuator 10C according to the present embodiment, the wiring layer provided on the circuit board 100 has a five-layer structure. Specifically, a seventh wiring 170 is formed on a sixth plane S6 that is the surface of the insulating film 104 and covered with an insulating film 105. Other configurations are the same as those of the actuator 10A according to the first embodiment, so the same reference numerals are given to the same elements, and overlapping description will be omitted.

Figure 22:
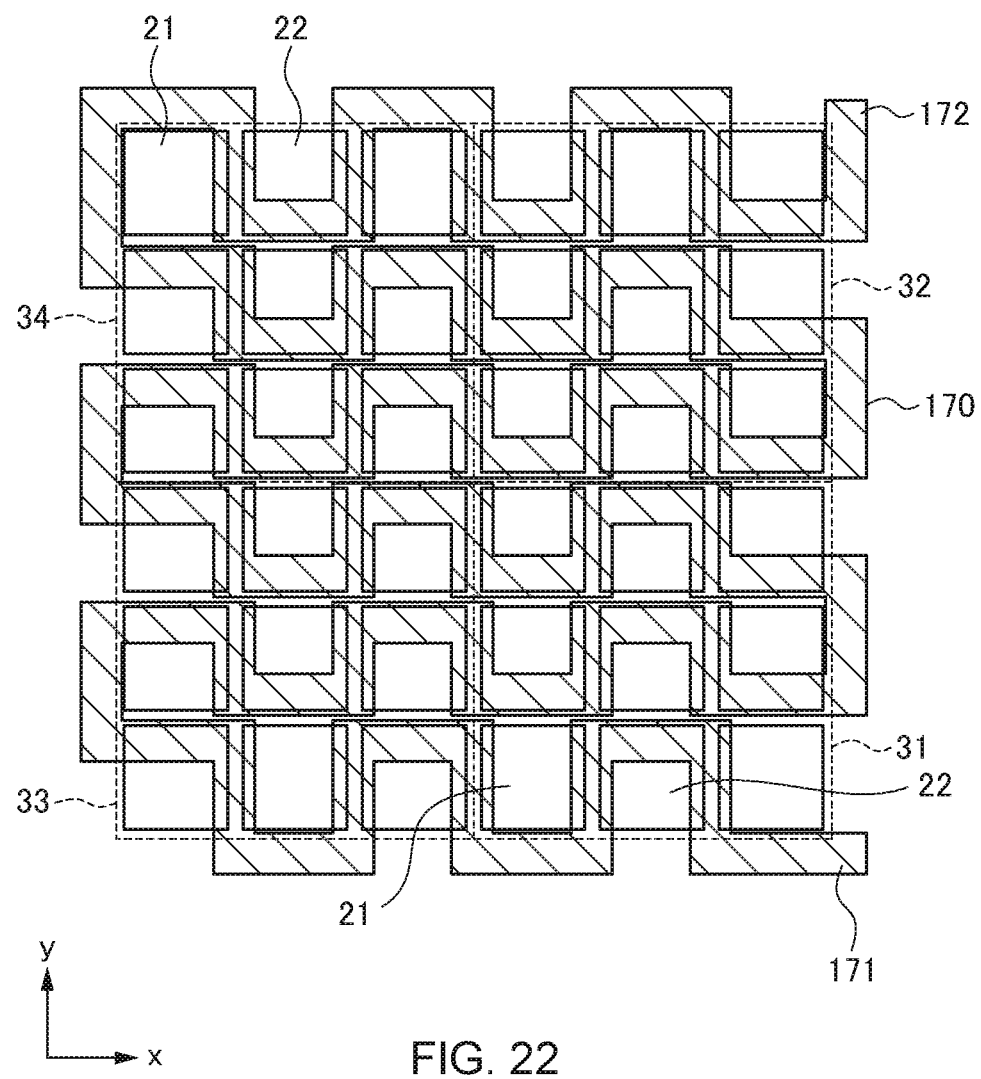
FIG. 22 is a plan view illustrating the configuration of the seventh wiring 170.

FIG. 22 is a plan view illustrating the configuration of the seventh wiring 170.

As illustrated in FIG. 22, the seventh wiring 170 has a configuration obtained by removing the terminal 115 from the first and second wirings 110 and 120 illustrated in FIG. 14. Thus, in the seventh wiring 170, current can flow from one end 171 thereof to the other end 172 and from the other end 172 to the one end 171. When current is made to flow from the one end 171 of the seventh wiring 170 to the other end 172, the attraction force F1 acts on all the first to fourth areas 31 to 34, while when current is made to flow from the other end 172 of the seventh wiring 170 to the one end 171, the repelling force F2 acts on all the first to fourth areas 31 to 34.

Thus, it is possible to change a gap in the z-direction between the magnet structure 20 and the circuit board 100 according to the direction and magnitude of the current flowing in the seventh wiring 170. As described above, in the present embodiment, the seventh wiring 170 for z-direction drive is separately provided, so that it is sufficient to control only the rotation (tilt) about the x- and y-axes for the first to fourth wirings 110, 120, 130 and 140. That is, the rotation control about the x- and y-axes and gap control can be separately performed using different currents, further facilitating the control.

Fourth Embodiment

Figure 23:
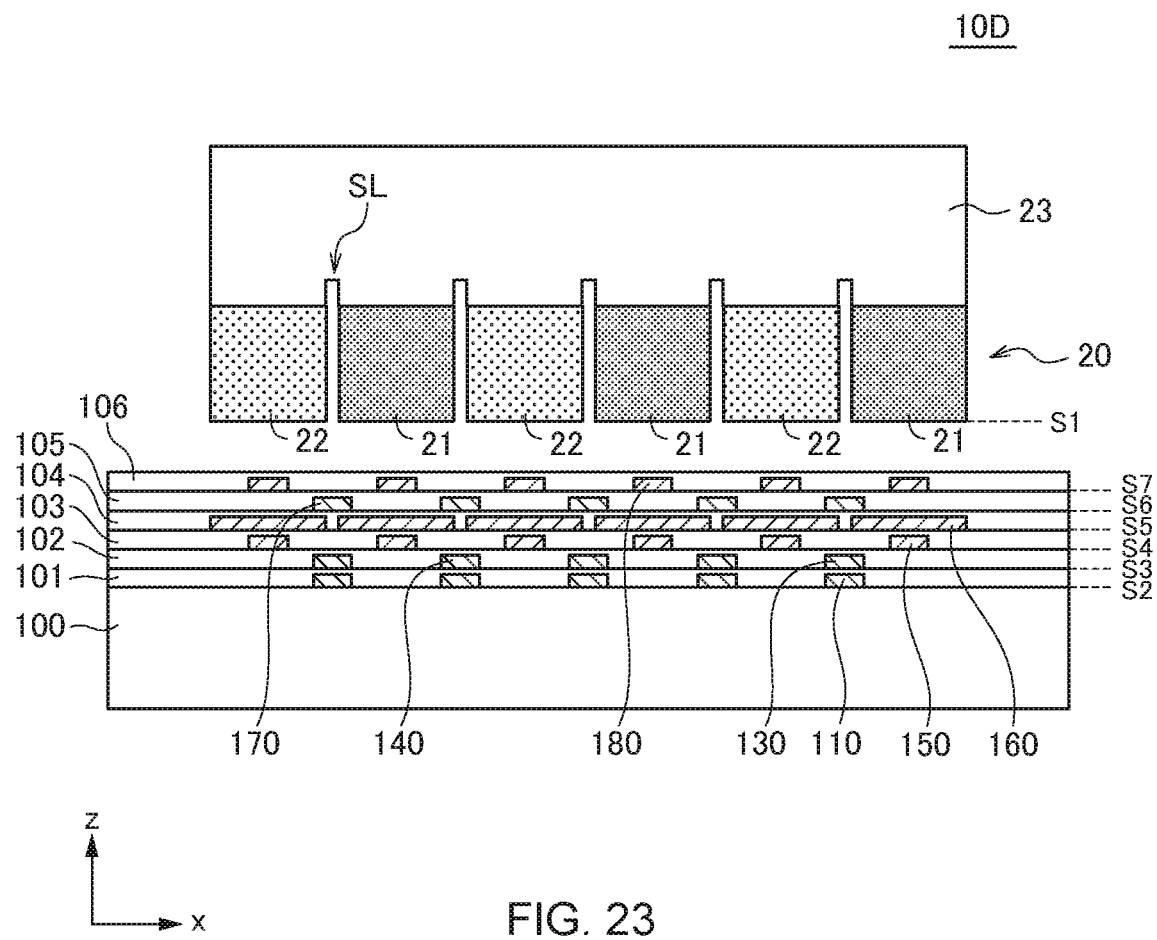
FIG. 23 is a schematic cross-sectional view illustrating the configuration of the main part of an actuator 10D according to a fourth embodiment of the present invention.

FIG. 23 is a schematic cross-sectional view illustrating the configuration of the main part of an actuator 10D according to the fourth embodiment of the present invention.

As illustrated in FIG. 23, in the actuator 10D according to the present embodiment, the wiring layer provided on the circuit board 100 forms a six-layer structure. Specifically, an eighth wiring 180 is formed on a seventh plane S7 which is the surface of the insulating film 105 and is covered with an insulating film 106. Other configurations are the same as those of the actuator 10C according to the third embodiment, so the same reference numerals are given to the same elements, and overlapping description will be omitted.

Figure 24:
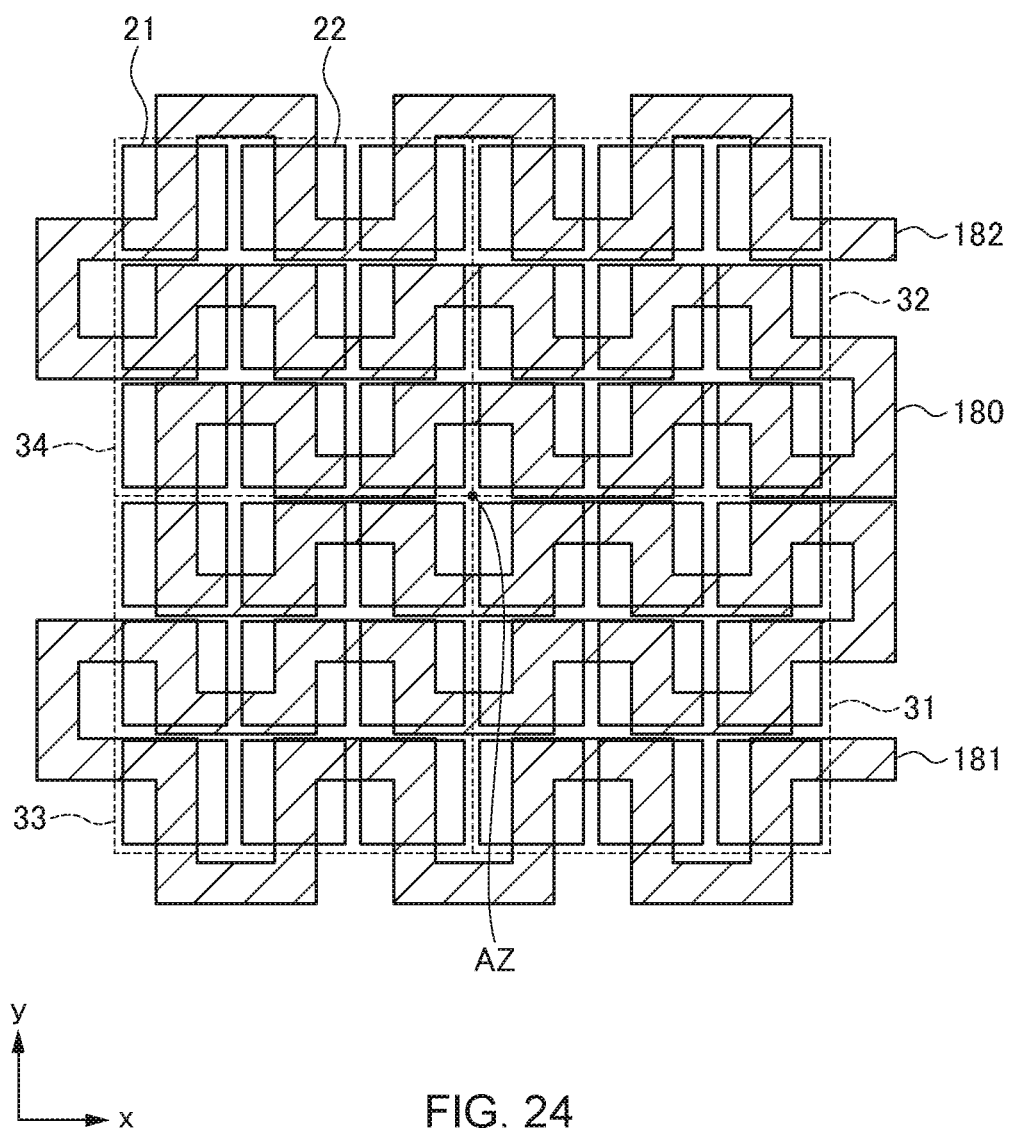
FIG. 24 is a plan view illustrating the configuration of the eighth wiring 180.

FIG. 24 is a plan view illustrating the configuration of the eighth wiring 180.

As illustrated in FIG. 24, the eighth wiring 180 has a configuration similar to the fifth wiring 150 illustrated in FIG. 6 but differs therefrom in that the meander shape of the eighth wiring 180 that covers the second and fourth areas 32 and 34 is shifted in the x-direction by one pitch from that of the fifth wiring 150 illustrated in FIG. 6. Thus, when current is made to flow from one end 181 of the eighth wiring 180 toward the other end 182, the current flows downward (in the negative y-direction) on the first magnet 21 and flows upward (in the positive y-direction) on the second magnet 22 in a part of the eighth wiring that covers the first and third areas 31 and 33; while in apart of the eighth wiring that covers the second and fourth areas 32 and 34, the current flows upward (in the positive y-direction) on the first magnet 21 and flows downward (in the negative y-direction) on the second magnet 22.

Thus, it is possible to relatively rotate the magnet structure 20 and circuit board 100 about the axis AZ extending in the z-direction according to the direction and magnitude of the current flowing in the eighth wiring 180. As described above, in the present embodiment, the eighth wiring 180 for rotation about the axis AZ is separately provided, so that it is sufficient to only perform drive control along the XY plane for the fifth or sixth wiring 150, 160. That is, the rotation control about the z-axis and two-dimensional motion control can be separately performed using different currents, further facilitating the control.

As the structure of the eighth wiring 180, not only the structure illustrated in FIG. 24, but also a structure similar to the fifth wiring 150 illustrated in FIG. 16 may be adopted.

Fifth Embodiment

Figure 25:
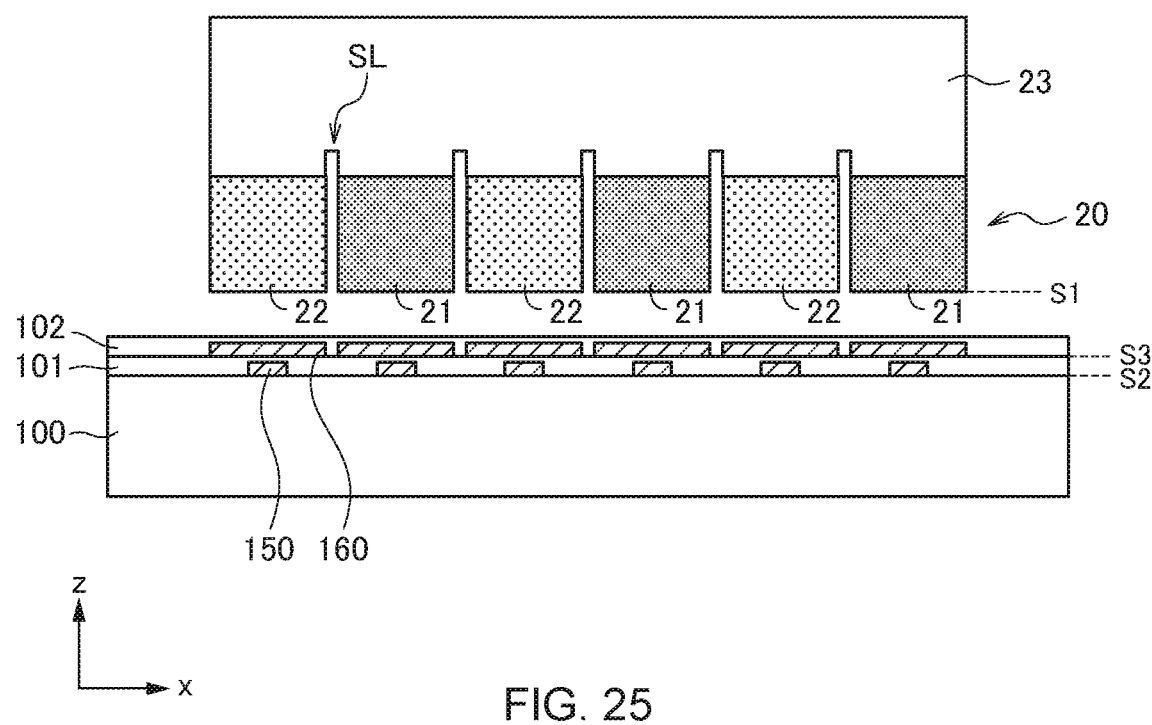
FIG. 25 is a schematic cross-sectional view illustrating the configuration of the main part of an actuator 10E according to a fifth embodiment of the present invention.

FIG. 25 is a schematic cross-sectional view illustrating the configuration of the main part of an actuator 10E according to the fifth embodiment of the present invention.

As illustrated in FIG. 25, in the actuator 10E according to the present embodiment, the wiring layer provided on the circuit board 100 forms a two-layer structure, and the first to fourth wirings 110, 120, 130 and 140, and insulating films 103 and 104 illustrated in FIG. 2 are removed. Other configurations are the same as those of the actuator 10A according to the first embodiment, so the same reference numerals are given to the same elements, and overlapping description will be omitted.

In the present embodiment, the fifth wiring 150 has the structure illustrated in FIG. 16, and the sixth wiring 160 has the structure illustrated in FIG. 7. Thus, the actuator 10E according to the present embodiment can perform two-dimensional motion and rotational motion about the axis AZ. As exemplified in the present embodiment, a configuration for performing rotational motion about the x- and y-axes is not essential in the present invention.

Sixth Embodiment

Figure 26:
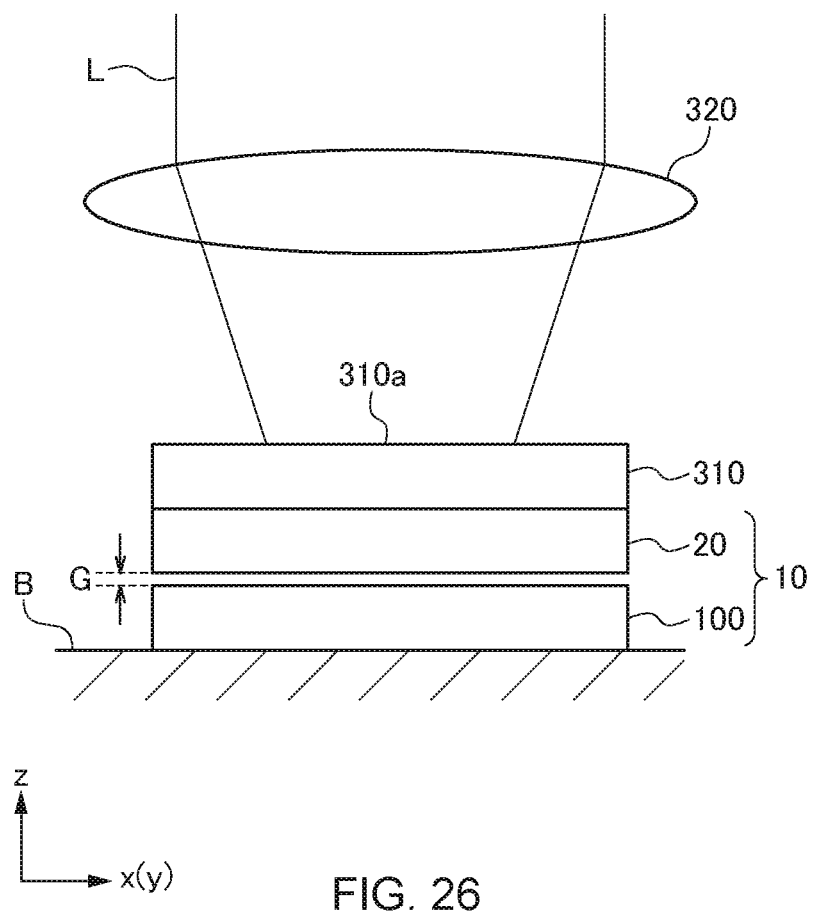
FIG. 26 is a schematic view illustrating an application example of an actuator 10.

FIG. 26 is a schematic view illustrating an application example of an actuator 10. The actuator 10 refers to the actuator according to the present invention and may be any one of the actuators 10A to 10E according to the above-described embodiments.

In the application example illustrated in FIG. 26, an image sensor 310 is fixed to the magnet structure 20. The circuit board 100 is fixed to a support B such as a casing, and a gap G is formed between the circuit board 100 and the magnet structure 20. The magnet structure 20 and image sensor 310 are flexibly supported on the support B.

An optical lens 320 is disposed above the image sensor 310. The optical lens 320 has a role of converging light L entering from the outside on a photoelectric conversion element formed on a surface 310a of the image sensor 310. When occurrence of a camera-shake is detected from an output signal from the image sensor 310 or an output signal from a not-shown acceleration sensor, current for cancelling the camera-shake is supplied to the circuit board 100 to change the position or angle of the image sensor 310, thereby allowing the influence of the camera-shake to be cancelled.

When the camera-shake has a tilt component about the x- or y-axis, a predetermined current is made to flow in, e.g., the first to fourth wirings 110, 120, 130 and 140 to tilt the image sensor 310 about the x- or y-axis, whereby the influence of the tilt component can be cancelled. When the camera-shake has a rotational component about the z-axis, a predetermined current is made to flow in, e.g., the eighth wiring 180 to rotate the image sensor 310 about the z-axis, whereby the influence of the rotational component can be cancelled. When the camera-shake has a shift component along the xy plane, a predetermined current is made to flow in, e.g., the fifth and sixth wirings 150 and 160 to two-dimensionally drive the image sensor 310 in the x- and y-directions, whereby the influence of the shift component can be cancelled.

Further, when a predetermined current is made to flow in, e.g., the seventh wiring 170 to change the size of the gap G, it is possible to realize an auto-focus function.

As described above, when the actuator 10 is fixed to the image sensor 310, the image sensor 310 can be driven in a desired direction or at a desired angle without interfering with the light path of the light L. Conversely to the example illustrated in FIG. 26, the magnet structure 20 and the circuit board 100 may be fixed to the support B and the image sensor 310, respectively.

It is apparent that the present invention is not limited to the above embodiments, but may be modified and changed without departing from the scope and spirit of the invention.

For example, although a part of each of the wirings is assigned to every one of the first and second magnets 21 and 22 in the above embodiments, this is not essential in the present invention.

REFERENCE SIGNS LIST 10, 10A-10E actuator
20 magnet structure
20a bulk magnet
21 first magnet
22 second magnet
21a, 22a block
23 support substrate
24 laser beam
31 first area
32 second area
33 third area
34 fourth area
100 circuit board
101-106 insulating film
110, 210 first wiring
120, 220 second wiring
130, 230 third wiring
140, 240 fourth wiring
150 fifth wiring
160 sixth wiring
170 seventh wiring
180 eighth wiring
111, 112, 121, 122, 131, 132, 141, 142, 151, 152, 161, 162 wiring part
113, 123, 133, 143, 154, 156, 164, 171, 181, 211, 221, 231, 241 one end
114, 1224, 134, 144, 155, 157, 165, 172, 182, 212, 222, 232, 242 other end
115 terminal
150A first part
150B second part
153 connection part
163 connection part
250 connection wiring
251, 252 through hole conductor
310 image sensor
310a surface of the image sensor
320 optical lens
B support
F1 attraction force
F2 repelling force
F3-F6 Lorentz force
G gap
I1-I6 current
L light
Lx, Ly array part
S1-S7 plane
SL slit

What is claimed is:

1. An actuator comprising:
   a magnet structure including a plurality of first magnets whose each magnetic pole surface has an N pole and a plurality of second magnets whose each magnetic pole surface has an S pole; and
   a circuit board including first, second, third, and fourth wirings and facing the magnetic pole surfaces of the respective first and second magnets through a gap,
   wherein the magnet structure includes first, second, third, and fourth areas, wherein the first and third areas are arranged in a first direction, wherein the second and fourth areas are arranged in the first direction, wherein the first and second areas are arranged in a second direction perpendicular to the first direction, wherein the third and fourth areas are arranged in the second direction, wherein when current is made to flow from one end of the first wiring to other end thereof, the current circulates in one direction at least partially on each of the first magnets positioned in the first and third areas, while it circulates in a direction opposite to the one direction at least partially on each of the second magnets positioned in the first and third areas, and wherein when current is made to flow from one end of the second wiring to other end thereof, the current circulates in the direction opposite to the one direction at least partially on each of the first magnets positioned in the second and fourth areas, while it circulates in the one direction at least partially on each of the second magnets positioned in the second and fourth areas, wherein when current is made to flow from one end of the third wiring to other end thereof, the current circulates in the one direction at least partially on each of the first magnets positioned in the first and second areas and also circulates in the direction opposite to the one direction at least partially on each of the second magnets positioned in the first and second areas, and wherein when current is made to flow from one end of the fourth wiring to other end thereof, the current circulates in the direction opposite to the one direction at least partially on each of the first magnets positioned in the third and fourth areas and also circulates in the one direction at least partially on each of the second magnets positioned in the third and fourth areas.

2. The actuator as claimed in claim 1, wherein the magnetic pole surfaces of the plurality of the first and second magnets is positioned on a first plane extending in the first and second directions, and wherein the magnet structure includes:
- a first array part in which the first and second magnets are alternately arranged in the first direction over the first and third areas;
- a second array part in which the first and second magnets are alternately arranged in the first direction over the second and fourth areas;
- a third array part in which the first and second magnets are alternately arranged in the second direction over the first and second areas; and
- a fourth array part in which the first and second magnets are alternately arranged in the second direction over the third and fourth areas.

3. The actuator as claimed in claim 2, wherein the first and second wirings are provided on a second plane parallel to the first plane, and wherein the third and fourth wirings are provided on a third plane parallel to the first plane and different from the second plane.

4. The actuator as claimed in claim 2, wherein the first to fourth wirings are provided on a third plane parallel to the first plane.

5. The actuator as claimed in claim 2, wherein the circuit board further includes fifth and sixth wirings, wherein the fifth wiring crosses, in the second direction, at least partially each of the first and second magnets included in the first and second array parts, and wherein the sixth wiring crosses, in the first direction, at least partially each of the first and second magnets included in the third and fourth array parts.

6. The actuator as claimed in claim 5, wherein the fifth wiring includes a first wiring part that crosses each of the first magnets in the second direction and a second wiring part that crosses each of the second magnets in the second direction, wherein the sixth wiring includes a third wiring part that crosses each of the first magnets in the first direction and a fourth wiring part that crosses each of the second magnets in the first direction, wherein current is made to flow in mutually opposite directions in the first wiring part and second wiring part, and wherein current is made to flow in mutually opposite directions in the third wiring part and fourth wiring part.

7. The actuator as claimed in claim 6, wherein the fifth wiring is provided on a fourth plane parallel to the first plane, and wherein the six wiring is provided on a fifth plane parallel to the first plane and different from the fourth plane.

8. The actuator as claimed in claim 5, wherein the fifth wiring includes a first part that covers the first and third areas and a second part that covers the second and fourth areas, and wherein current is made to flow in the first and second parts independently of each other.

9. The actuator as claimed in claim 2, wherein the circuit board further includes a seventh wiring, wherein the seventh wiring includes a fifth wiring part that circles at least partially on each of the first magnets positioned in the first to fourth areas and a sixth wiring part that circles at least partially on each of the second magnets positioned in the first to fourth areas, and wherein currents that circulate in opposite directions are made to flow in the fifth and sixth wiring parts.

10. The actuator as claimed in claim 2, wherein the circuit board further includes an eighth wiring, wherein the eighth wiring includes a seventh wiring part that crosses each of the first magnets in the second direction and an eighth wiring part that crosses each of the second magnets in the second direction, wherein in a part of the eighth wiring that covers the first and third areas, opposite-direction currents are made to flow in the seventh and eighth wiring parts, wherein in a part of the eighth wiring that covers the second and fourth areas, opposite-direction currents are made to flow in the seventh and eighth wiring parts, wherein in a part of the seventh wiring part that covers the first and third areas and in a part thereof that covers the second and fourth areas, opposite-direction currents are made to flow, and wherein in a part of the eighth wiring part that covers the first and third areas and in a part thereof that covers the second and fourth areas, opposite-direction currents are made to flow.

11. The actuator as claimed in claim 1, wherein a size of the first and second magnets in the first and second directions is 1 mm or less.

12. The actuator as claimed in claim 1, wherein a thickness of the magnet structure in a third direction perpendicular to the first and second directions is 1 mm or less.

13. The actuator as claimed in claim 1, further comprising a support substrate for supporting the magnet structure,
wherein the thermal diffusivity of the support substrate is lower than that of the magnet structure.

14. The actuator as claimed in claim 1, wherein an image sensor is fixed to one of the circuit board and magnet structure.

15. An actuator comprising:
a magnet structure including a plurality of first magnets whose each magnetic pole surface has an N pole and a plurality of second magnets whose each magnetic pole surface has an S pole; and
a circuit board including first and second wirings and facing the magnetic pole surfaces of the respective first and second magnets through a gap,
wherein the magnetic structure includes a first area and a second area
wherein the first area includes a first array part in which the first and second magnets are alternately arranged in a first direction,
wherein the second area includes a second array part in which the first and second magnets are alternately arranged in the first direction,
wherein the first and second areas are arranged in a second direction perpendicular to the first direction,
wherein the first wiring includes:
a first wiring part that crosses each of the first magnets included in the first array part in the second direction such that the first wiring part overlaps each of the first magnets included in the first array part in a third direction perpendicular to the first and second directions; and
a second wiring part that crosses each of the second magnets included in the first array part in the second direction such that the second wiring part overlaps each of the second magnets included in the first array part in the third direction,
wherein the second wiring includes:
a third wiring part that crosses each of the first magnets included in the second array part in the second direction such that the third wiring part overlaps each of the first magnets included in the second array part in the third direction; and
a fourth wiring part that crosses each of the second magnets included in the second array part in the second direction such that the fourth wiring part overlaps each of the second magnets included in the second array part in the third direction,
wherein opposite-direction currents are made to flow in the first and second wiring parts,
wherein opposite-direction currents are made to flow in the third and fourth wiring parts, and
wherein opposite-direction currents can be made to flow in the first and third wiring parts, and opposite-direction currents can be made to flow in the second and fourth wiring parts.

16. The actuator as claimed in claim 15, wherein the first and second wiring parts and third and fourth wiring parts are separated from each other to allow currents to flow independently of each other.

17. The actuator as claimed in claim 15, wherein the same direction current are made to flow in the first and third wiring parts, and the same direction current are made to flow in the second and fourth wiring parts.

18. An actuator comprising:
a magnet structure including a plurality of first magnets whose each magnetic pole surface has an N pole and a plurality of second magnets whose each magnetic pole surface has an S pole; and
a circuit board including first, second, third, and fourth wirings and facing the magnetic pole surfaces of the respective first and second magnets through a gap,
wherein the magnet structure has a structure in which the magnetic pole surfaces of the plurality of the first magnets and the magnetic pole surfaces of the plurality of the second magnets are alternately arranged in a first direction and a second direction perpendicular to the first direction on a first plane extending in the first and second directions,
wherein the magnet structure includes first and second areas,
wherein when current is made to flow from one end of the first wiring to other end thereof, the current circulates in one direction at least partially on each of the first magnets positioned in the first area, while it circulates in a direction opposite to the one direction at least partially on each of the second magnets positioned in the first area,
wherein when current is made to flow from one end of the second wiring to other end thereof, the current circulates in the direction opposite to the one direction at least partially on each of the first magnets positioned in the second area, while it circulates in the one direction at least partially on each of the second magnets positioned in the second area,
wherein the magnet structure includes a first array part in which the first and second magnets are alternately arranged in the first direction and a second array part in which the first and second magnets are alternately arranged in the second direction,
wherein the third wiring crosses, in the second direction, at least partially each of the first and second magnets included in the first array part, and
wherein the fourth wiring crosses, in the first direction, at least partially each of the first and second magnets included in the second array part.

19. The actuator as claimed in claim 18,
wherein the third wiring includes a first wiring part that crosses each of the first magnets in the second direction and a second wiring part that crosses each of the second magnets in the second direction,
wherein the fourth wiring includes a third wiring part that crosses each of the first magnets in the first direction and a fourth wiring part that crosses each of the second magnets in the first direction,
wherein current is made to flow in mutually opposite directions in the first wiring part and second wiring part, and
wherein current is made to flow in mutually opposite directions in the third wiring part and fourth wiring part.

20. The actuator as claimed in claim 19,
wherein the third wiring is provided on a second plane parallel to the first plane, and
wherein the fourth wiring is provided on a third plane parallel to the first plane and different from the second plane.

* * * * *